(12) United States Patent
Sato

(10) Patent No.: US 8,994,145 B2
(45) Date of Patent: Mar. 31, 2015

(54) SEMICONDUCTOR DEVICE INCLUDING CAPACITOR UNDER PAD

(75) Inventor: Jumpei Sato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 13/235,399

(22) Filed: Sep. 18, 2011

(65) Prior Publication Data

US 2012/0161217 A1 Jun. 28, 2012

(30) Foreign Application Priority Data

Dec. 27, 2010 (JP) ................. 2010-290998

(51) Int. Cl.
*H01L 21/02* (2006.01)
*H01L 27/115* (2006.01)
*H01L 49/02* (2006.01)
*H01L 29/861* (2006.01)
*H01L 23/00* (2006.01)

(52) U.S. Cl.
CPC .......... *H01L 27/11526* (2013.01); *H01L 28/40* (2013.01); *H01L 29/8611* (2013.01); *H01L 24/05* (2013.01); *H01L 2224/02166* (2013.01); *H01L 2224/04042* (2013.01); *H01L 2924/01019* (2013.01); *H01L 2924/01021* (2013.01)
USPC ............. 257/532; 257/E27.025; 257/E27.048

(58) Field of Classification Search
USPC ................. 257/303, 306, 307, 516, 532–535, 257/E27.016, E27.025, E27.033, E27.034, 257/E27.048, E27.071, E29.343, E21.008; 438/239, 253, 387, 396–399
See application file for complete search history.

(56) References Cited

U.S. PATENT DOCUMENTS

| 6,157,563 | A | * | 12/2000 | Hirano et al. ................. 365/145 |
| 2004/0235245 | A1 | * | 11/2004 | Summerfelt ................. 438/257 |
| 2007/0090526 | A1 | | 4/2007 | Otsuki |
| 2007/0200242 | A1 | | 8/2007 | Azuma |
| 2008/0013230 | A1 | | 1/2008 | Suzuki |
| 2011/0024867 | A1 | * | 2/2011 | Tseng et al. ................. 257/459 |

FOREIGN PATENT DOCUMENTS

| EP | 1 176 640 A2 | 1/2002 |
| JP | 4-167449 A | 6/1992 |
| JP | 11-186320 A | 7/1999 |
| JP | 2000-31383 A | 1/2000 |
| JP | 2000-31415 A | 1/2000 |
| JP | 2001-284537 A | 10/2001 |

(Continued)

OTHER PUBLICATIONS

Office Action issued Jan. 7, 2014 in Japanese Patent Application No. 2010-290998 with English language translation.

*Primary Examiner* — Tucker Wright
(74) *Attorney, Agent, or Firm* — Oblon, McClelland, Maier & Neustadt, L.L.P.

(57) ABSTRACT

According to one embodiment, a semiconductor device includes a semiconductor chip which includes a semiconductor integrated circuit provided in an insulator, a first pad a pad having an upper surface of which is exposed via an opening formed in the insulator, and capacitors provided in a capacitor region of the semiconductor chip under the pad. The capacitors are provided in the capacitor region to satisfy a rule of a coverage. And contacts respectively connected to two electrodes of the capacitors are provided at positions that do not vertically overlap the opening.

19 Claims, 16 Drawing Sheets

(56) References Cited

FOREIGN PATENT DOCUMENTS

| JP | 2002-246407 A | 8/2002 |
| JP | 2003-318288 A | 11/2003 |
| JP | 2004-288786 | 10/2004 |
| JP | 2006-505933 A | 2/2006 |
| JP | 2008-21847 A | 1/2008 |

* cited by examiner

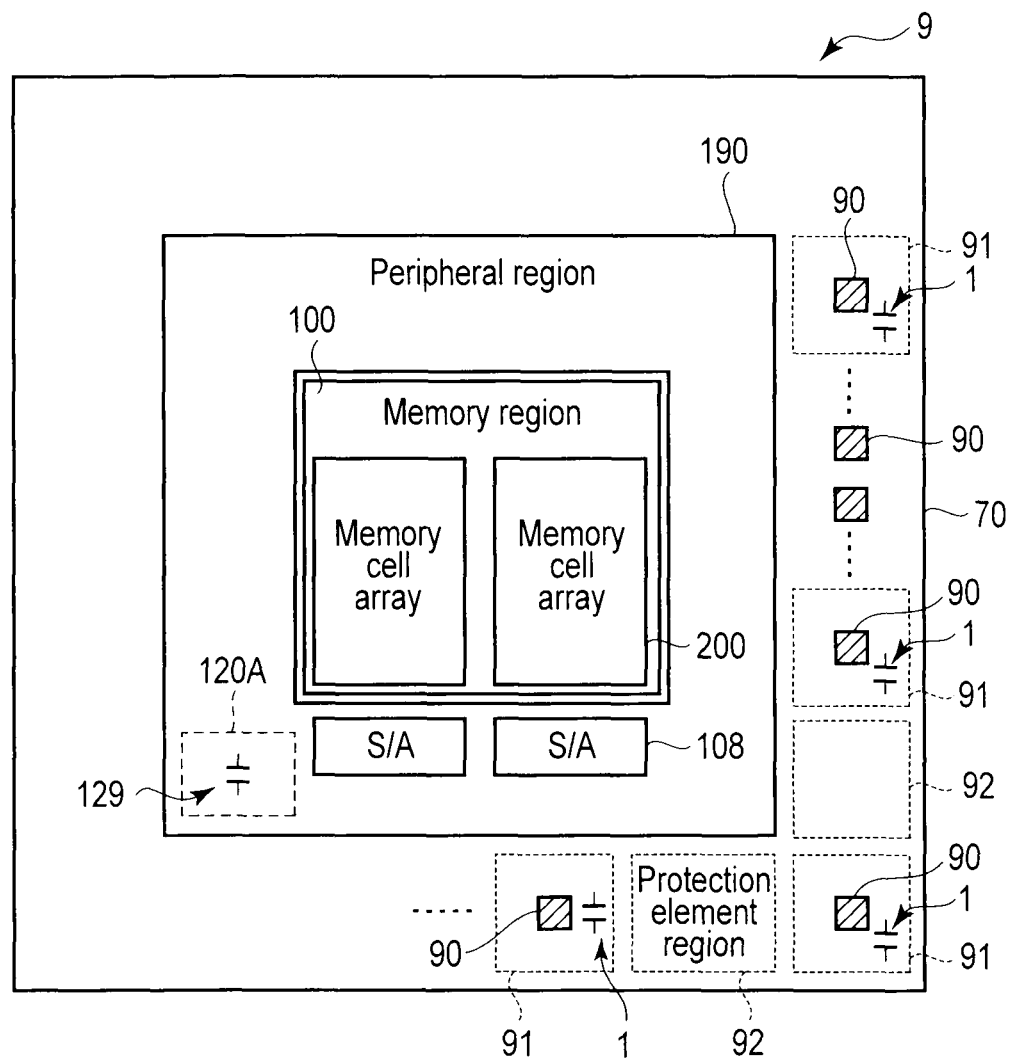
F I G. 3

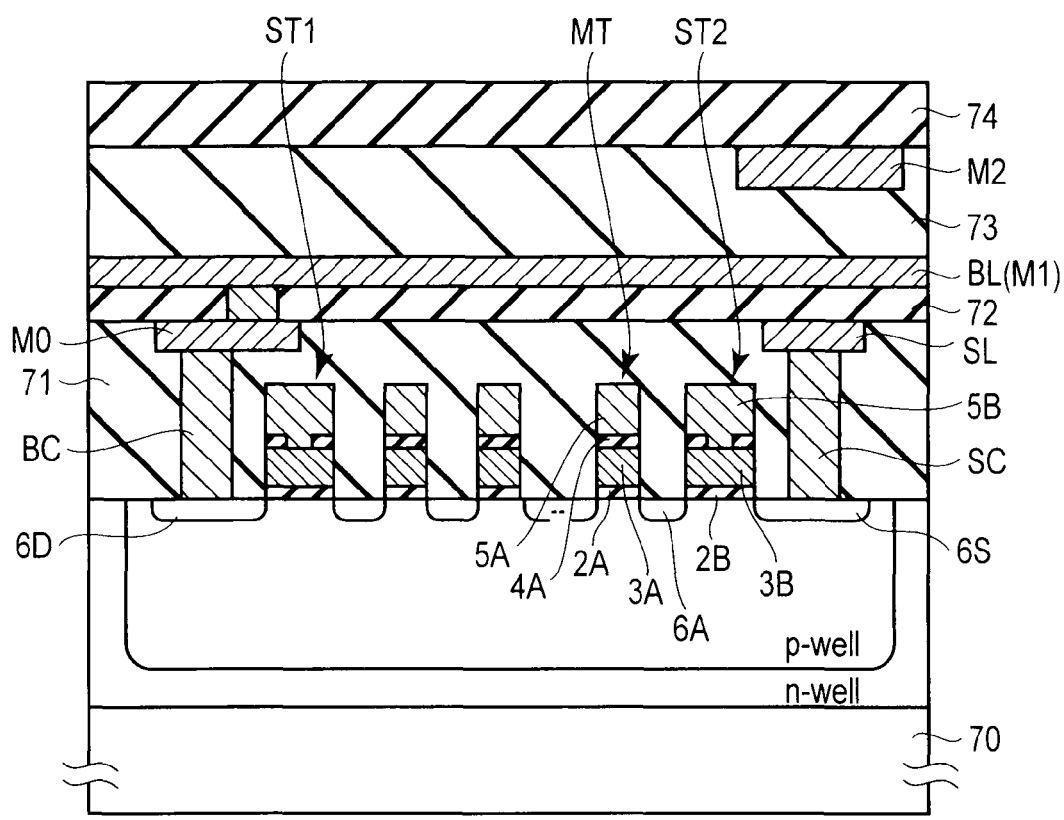
F I G. 4

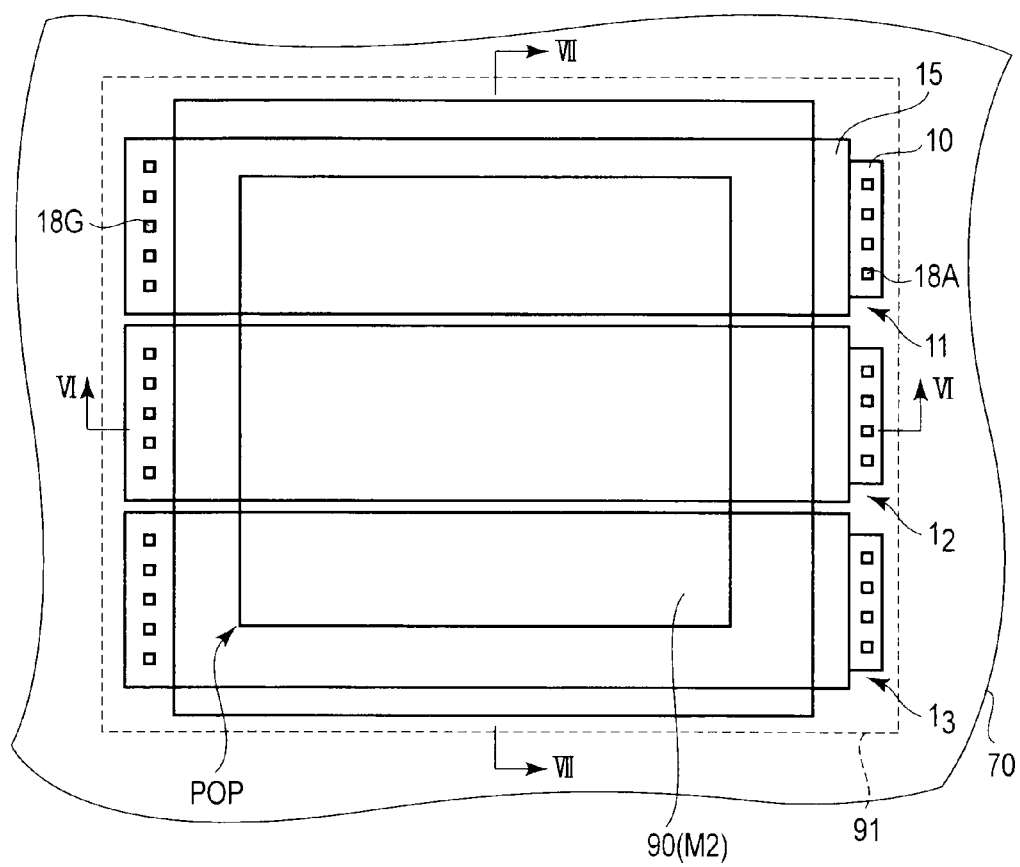
F I G. 5

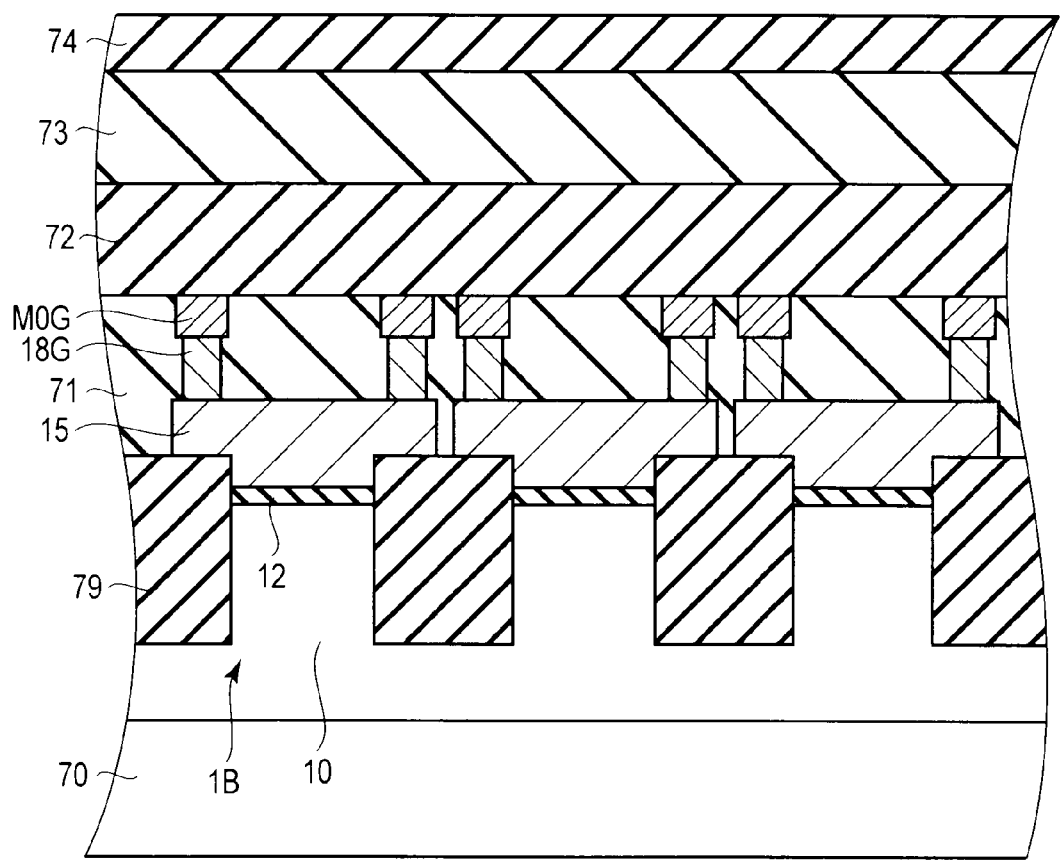
F I G. 13

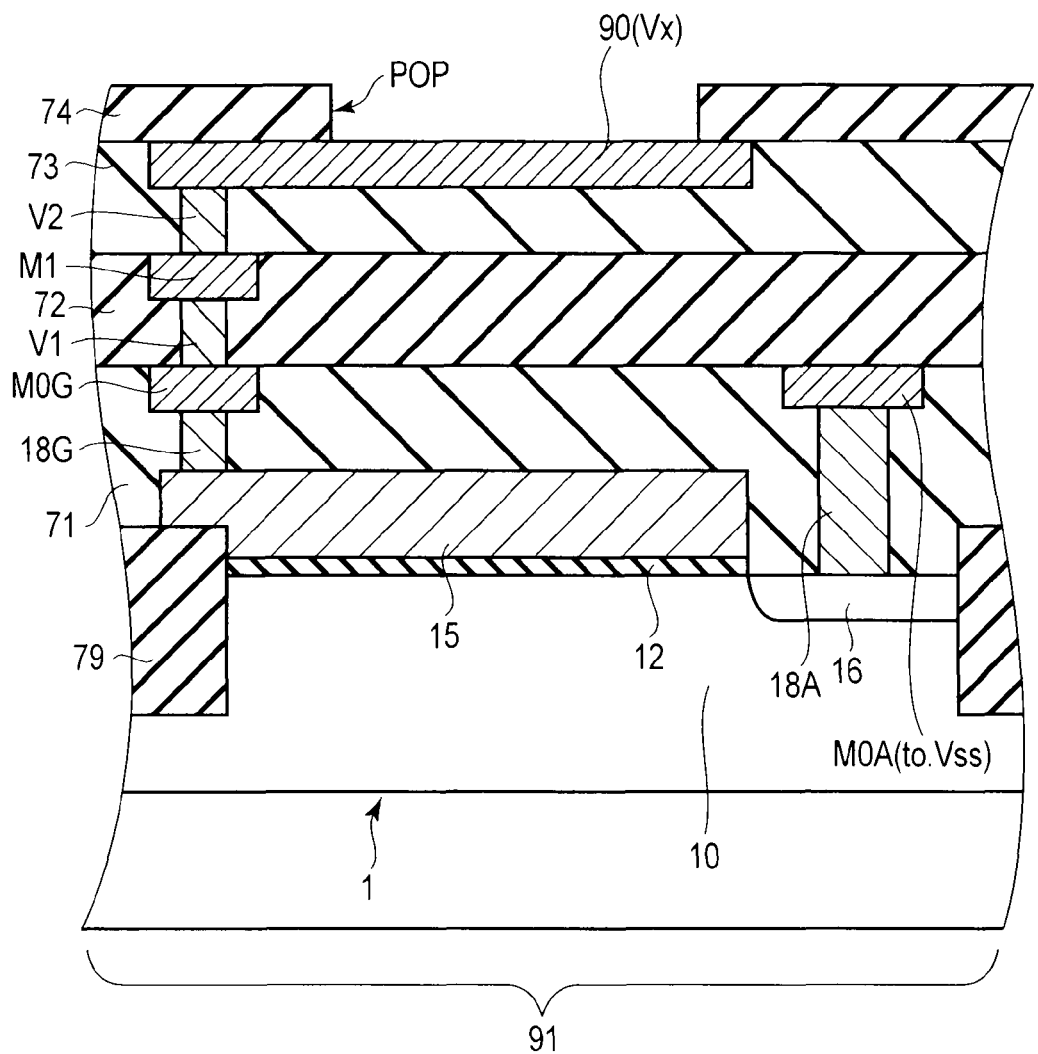
F I G. 17

SEMICONDUCTOR DEVICE INCLUDING CAPACITOR UNDER PAD

CROSS-REFERENCE TO RELATED APPLICATIONS

This application is based upon and claims the benefit of priority from prior Japanese Patent Application No. 2010-290998, filed Dec. 27, 2010, the entire contents of which are incorporated herein by reference.

FIELD

Embodiments described herein relate generally to a semiconductor device.

BACKGROUND

A semiconductor chip is electrically connected to the substrate of an electronic device by bonding wires to pads provided on the chip.

When a wire is bonded to a pad, mechanical stress resulting from the bonding is applied to the pad and members under the pad. Not only during the bonding but also during a product test, mechanical stress is applied to the pad and the members under the pad by the probe needle of a tester.

The mechanical stress produced during the bonding and during the test may cause structural damage to the members under the pad, and break (short-circuit) interconnects and crack an interlayer insulating film and contacts.

BRIEF DESCRIPTION OF THE DRAWINGS

FIG. 3 is a plan view showing an example of the layout of the semiconductor device according to the embodiment;

FIG. 4 is a sectional view showing an example of the structure of a memory element;

FIG. 5 is a plan view showing an example of the layout of the semiconductor device according to the embodiment;

FIG. 13 is a sectional view showing an example of the structure of the semiconductor device according to the embodiment;

FIG. 17 is a diagram for explaining the application example.

DETAILED DESCRIPTION

[Embodiments]

A semiconductor device according to embodiments is explained below with reference to the drawings. In the following explanation, elements having the same functions and configurations are provided with the same signs and are repeatedly explained when necessary.

In general, according to one embodiment, a semiconductor device includes a semiconductor chip which includes a semiconductor integrated circuit provided in an insulator; a first pad a pad having an upper surface of which is exposed via an opening formed in the insulator; and capacitors provided in a capacitor region of the semiconductor chip under the pad. The capacitors are provided in the capacitor region to satisfy a rule of a coverage, and contacts respectively connected to two electrodes of the capacitors are provided at positions that do not vertically overlap the opening.

(1) First Embodiment

A semiconductor device according to the first embodiment is described with reference to FIG. 1 to FIG. 7.

Figure 1:
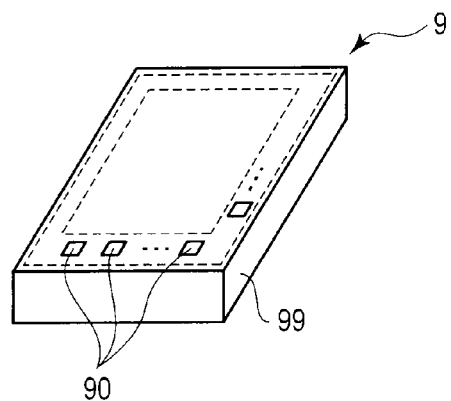
FIG. 1 is a diagram showing the overall structure of a semiconductor device according to an embodiment.

FIG. 1 shows a semiconductor device 9 according to the present embodiment.

In the semiconductor device 9 according to the present embodiment shown in FIG. 1, a semiconductor chip (semiconductor substrate) in which a semiconductor integrated circuit is formed is covered with an insulator 99.

Pads 90 are provided along the edge of the semiconductor device 9 on the upper surface (front surface) of the insulator 99. The semiconductor chip in the insulator 99 is electrically connected to other devices by bonding to the pads 90, thereby forming an electronic device. However, some of the pads are not bonded. The direction along the arrangement direction of the pads 90 is also referred to as a pad arrangement direction.

The semiconductor device 9 is, for example, a semiconductor memory.

Figure 2:
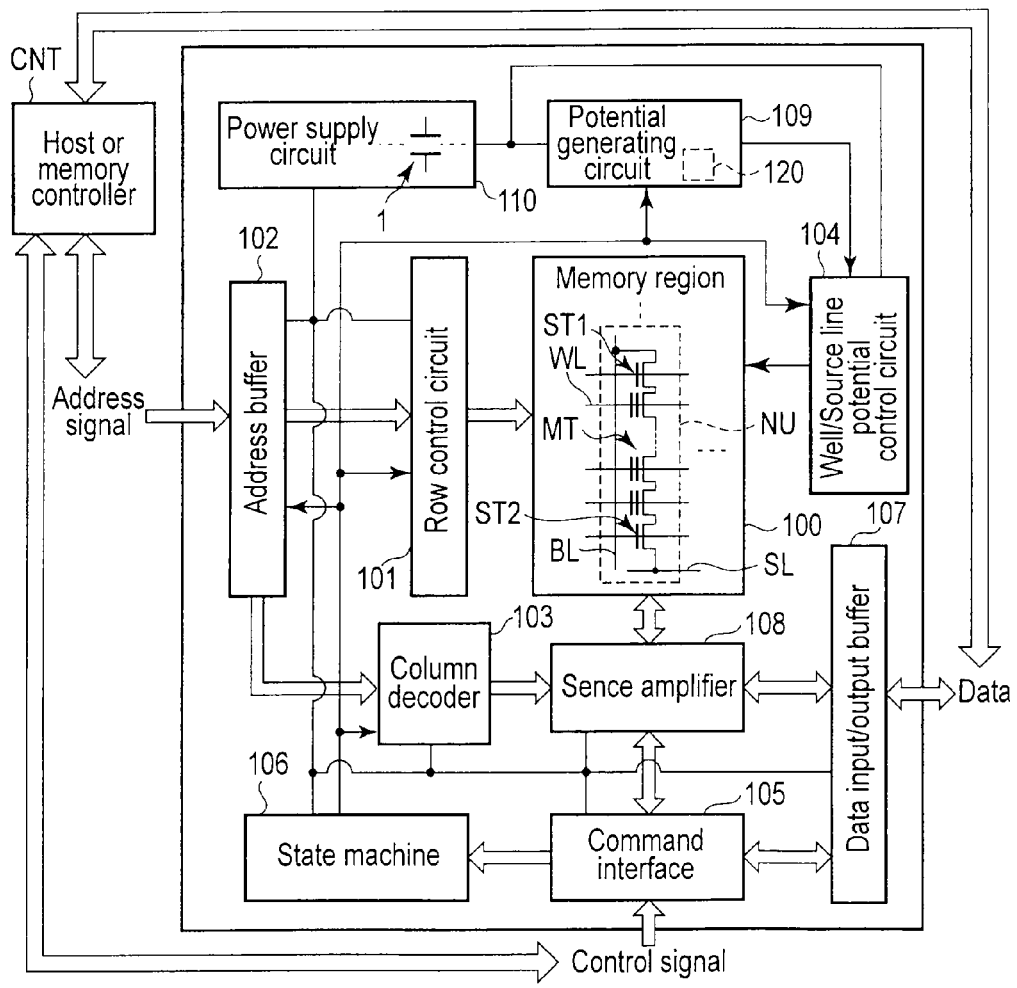
FIG. 2 is a block diagram showing an example of a circuit configuration of the semiconductor device according to the embodiment.

FIG. 2 is a block diagram showing an example of a circuit configuration of the semiconductor memory as the semiconductor device.

A memory region 100 has memory cell transistors and select transistors. A word line WL is connected to the gate of each memory cell transistor MT.

For example, in a NAND flash memory, current paths of the memory cell transistors MT are connected in series. The configuration of the memory cell transistors MT having their current paths connected in series is referred to as a NAND string.

Select transistors ST1 and ST2 are connected to one end of the NAND string and the other, respectively. One end of the current path of one select transistor ST1 is connected to the drain side of the NAND string, and the other end of the current path of select transistor ST1 is connected to a bit line BL. One end of the current path of the other select transistor ST2 is connected to the source side of the NAND string, and the other end of the current path of select transistor ST2 is connected to a source line SL.

The gates of select transistors ST1 and ST2 are connected to select gate lines, respectively.

A configuration NU constituted of the NAND string and the select transistors connected to both ends of the NAND string is referred to as a NAND cell unit NU.

The NAND cell units NU are provided in the memory region 100.

A row control circuit 101 controls the rows of the memory region 100. The row control circuit 101 is connected to the word lines and the select gate lines.

The row control circuit 101 drives the word lines and the select gate lines to access a memory cell transistor selected in accordance with an address signal from an address buffer 102.

A column decoder 103 drives a sense amplifier 108 to select a column of the memory region 100 in accordance with an address signal from an address buffer 102.

The sense amplifier 108 is connected to the bit lines BL. The sense amplifier 108 detects a potential variation of the bit line BL during data reading, and determines data stored in the memory cell transistor MT. In data writing, the sense amplifier 108 holds data to be written. The sense amplifier 108 also temporarily holds a judgment result during verification.

A data input/output buffer 107 temporarily holds externally input data or data output from the memory region 100 via the sense amplifier 108.

A well/source line potential control circuit 104 controls the potential of a well region (semiconductor region) in which the memory cell transistors MT are provided, and the potential of the source line SL, in accordance with the operation on the memory cell transistors (NAND cell units NU).

A power supply circuit 110 outputs an external voltage to the respective circuits 101 to 109 on the chip. The power supply circuit 110 has a stabilization circuit including capacitors 1.

The potential generating circuit 109 increases the voltage from the power supply circuit 110, and generates a program voltage or an erase voltage. The potential generating circuit 109 outputs the generated voltage to the row control circuit 101 and the well/source line potential control circuit 104. The potential generating circuit 109 has a charge pump 120 for boost-up the voltage. The charge pump 120 includes capacitors.

The overall operation of the memory chip is controlled by a command interface 105 and a state machine 106 in accordance with a control signal from an external device (e.g., a host CNT or a memory controller CNT). The command interface 105 and the state machine 106 control the row control circuit 101, the column decoder 103, the well/source line potential control circuit 104, the data input/output buffer 107, the sense amplifier 108, and the potential generating circuit 109 in accordance with the operation (writing, reading, or erasing) of the flash memory.

FIG. 3 shows an example of the layout of the circuits formed in a semiconductor chip of the semiconductor device 9.

The memory region 100 is provided in a semiconductor chip 70, and a peripheral region 190 is provided adjacent to the memory region 100. In the peripheral region 190, circuits for driving the memory region are provided, such as the row control circuit 101, the potential generating circuit 109, the power supply circuit 110, and the state machine 106 that are described above.

A region (referred to as a pad arrangement region) for placing the pads 90 is provided at the edge of the semiconductor chip 70.

Protection element regions 92 in which protection elements for the semiconductor integrated circuit are formed are provided at the edge of the semiconductor chip 70. For example, an ESD protection element is provided in the protection element region 92. The peripheral region 190 is provided in a region of the chip 70 inside the region where a pad arrangement region 91 and the protection element region 92 are disposed (on the side of the memory region).

For example, memory cell arrays 200 are provided in the memory region 100. Although two memory cell arrays (first and second memory cell arrays) 200 are shown in FIG. 3 for simplicity, the number of memory cell arrays is not limited thereto. The two memory cell arrays 200 are adjacent to each other.

One sense amplifier 108 is provided in the peripheral region 190 to correspond to one memory cell array 200. The sense amplifier 108 is provided at one end of the memory cell array 200. Two sense amplifiers 108 respectively corresponding to the two memory cell arrays 200 are adjacent to each other.

Here, in the example shown in FIG. 3, the sense amplifiers 108 are disposed to concentrate on one side (one end) of the memory cell array 200 (this may hereinafter be referred to as a "single-sided sense amplifier structure"). In contrast with the single-sided sense amplifier structure, sense amplifiers may be disposed on both sides (one end and the other) of the memory cell array 200 across the memory cell array 200 (this may hereinafter be referred to as a "double-sided sense amplifier structure"). In general, the pads (power supply pads) 90 for power supply are disposed at one end of the memory cell array 200.

When the double-sided sense amplifier structure is used, a power supply interconnect has to be passed between adjacent memory cell arrays 200 to supply power to the sense amplifier provided at the other end. On the other hand, when the single-sided sense amplifier structure is used, there is no need to ensure a region for passing the power supply interconnect between the memory cell arrays 200 by disposing the sense amplifiers 108 adjacent to the pads 90, thereby allowing a reduction in chip area.

In the double-sided sense amplifier structure, the region for passing the power supply interconnect is often a dead space where peripheral circuits (e.g., a row decoder) cannot be disposed. Therefore, in the double-sided sense amplifier structure, a capacitor can be disposed in a region immediately under the power supply interconnect. In contrast, when the single-sided sense amplifier structure is used, the area between the adjacent memory cell arrays 200 is smaller, and securing a space enough to dispose a capacitor is difficult. Thus, according to the present embodiment, a capacitor 1 is disposed immediately under the pad 90, so that the increase of the area of the semiconductor device can be inhibited even when the single-sided sense amplifier structure is used. That is, a space to provide the power supply interconnect to the sense amplifier 108 can be eliminated by using the single-sided sense amplifier structure and disposing the capacitor 1 immediately under the pad 90 in the region adjacent to the sense amplifier 108.

Although two memory cell arrays 200 are provided in the example described with reference to FIG. 3, one memory cell array 200 can also provide similar advantages. This is because even when there is one memory cell array 200 and the double-sided sense amplifier structure is used, an interconnect may be passed across both sides of the memory cell array 200.

FIG. 4 shows the sectional structure of one NAND cell unit NU provided in the memory cell array 200.

As shown in FIG. 4, the memory cell transistor MT is, for example, a field effect transistor having a stack gate structure including a charge storage layer and a control gate electrode.

A charge storage layer 3A is provided on a gate insulating film 2A formed on the surface of the semiconductor substrate 70. A control gate electrode 5A is stacked on the charge storage layer 3A via an intergate insulating film 4A which is formed on the charge storage layer 3A. The charge storage layer 3A is separated for the memory cell transistors MT in the channel width direction of the transistors.

The charge storage layer 3A may be, for example, a floating gate electrode made of polysilicon or a trap layer of silicon nitride.

The intergate insulating film 4A may be, for example, a silicon oxide film, a silicon nitride film, or a stack film of a silicon oxide film and a silicon nitride film (e.g., an ONO film). The intergate insulating film may be a high-dielectric insulating film (high-k film) of, for example, hafnium oxide or aluminum oxide.

The control gate electrode 5A functions as, for example, a word line, and extends in the channel width direction of the transistors. The control gate electrode 5A is shared by the memory cell transistors arranged in the channel width direction.

In the NAND cell unit NU, the memory cell transistors MT adjacent in the channel length direction share a source/drain diffusion layer 6A, such that the memory cell transistors MT are connected in series.

Select transistors ST1 and ST2 and the NAND string (the memory cell transistors connected in series) share the source/drain diffusion layer 6A, such that select transistors ST1 and ST2 are connected to one end of the NAND string and the other.

Select transistors ST1 and ST2 are formed simultaneously with the formation of the memory cell transistors MT by substantially the same process. A first electrode layer 3B formed simultaneously with the floating gate electrode 3A is provided on a gate insulating film 2B formed on the surface of the semiconductor chip 70. A second electrode layer 5B formed simultaneously with the control gate electrode 5A is stacked on the first electrode layer 3B. An insulating film 4B formed simultaneously with the intergate insulating film 4A is provided between the first electrode layer 3B and the second electrode layer 5B. An opening is formed in the insulating film 4B, and the two electrode layers 3B and 5B are electrically connected to each other through the opening.

The second electrode layer 5B is used as a select gate line similarly to the control gate electrode 5A as the word line, and extends in the channel width direction. The second electrode layer 5B as the select gate line is shared by select transistors ST1 and ST2 arranged in the channel width direction.

A source/drain diffusion layer 6D of select transistor ST1 is connected to a first metal layer M0 via a bit line contact BC. The first metal layer M0 is located at a first interconnect level from the substrate side to the pad side in a direction perpendicular to the surface of the substrate.

The first metal layer M0 is connected to a second metal layer M1 as the bit line BL via a via contact V1.

The second metal layer M1 is located at a second interconnect level from the substrate side to the pad side.

A source/drain diffusion layer 6S of select transistor ST2 is connected to the source line SL via a source line contact SC.

A first interlayer insulating film 71 is provided on the semiconductor chip 70 to cover the transistors MT, ST1, and ST2. A second interlayer insulating film 72 is provided on the first interlayer insulating film 71. A third interlayer insulating film 73 is provided on the second interlayer insulating film 72 and metal layer M1. A third metal layer M2 is provided in the third interlayer insulating film 73. The third metal layer M2 is located at a third interconnect level from the substrate side to the pad side.

An insulator 74 is provided on metal layer M2 and the interlayer insulating film 73. Although the insulator 74 shown in FIG. 4 has a single-layer structure, the insulator 74 may have a stack structure that includes a protective film and a passivation film. A sealing layer may be separately provided to cover the insulating film 74.

The pad 90 is made of, for example, a conductor (metal layer) provided at the same interconnect level as the third metal layer M2. The pad 90 is connected to lower interconnects and circuits via the contact embedded in interlayer insulating films 71, 72, and 73.

In the semiconductor device 9 according the present embodiment, the capacitor region 91 is provided on the semiconductor chip 70 under the pad 90. The capacitors 1 are provided in the capacitor region 91.

For example, the capacitor region 91 is adjacent to the protection element region 92 in a direction parallel to the side of the semiconductor chip 70 (the arrangement direction of the pads 90). The capacitor region 91 may be adjacent to, for example, the region where the sense amplifier 108 is provided, in a direction that intersects with the side of the semiconductor chip 70 (a direction that intersects with the arrangement direction of the pads 90). Also, the capacitor region 91 may be adjacent to, for example, a region 120A where a capacitor 129 of the charge pump 120 is provided.

The structure of the capacitor region 91 provided under the pad is described with reference to FIG. 5 to FIG. 7.

FIG. 5 is a schematic plan view showing the layout of the pad 90 and the capacitor region 91 under the pad 90. In FIG. 5, the structure of the pad 90 is shown in the form of an independent rectangular pattern for clarity. Moreover, the pad 90 is connected to the circuits formed on the surface of the semiconductor chip by interconnects (not shown) drawn from the pad 90.

Figure 6:
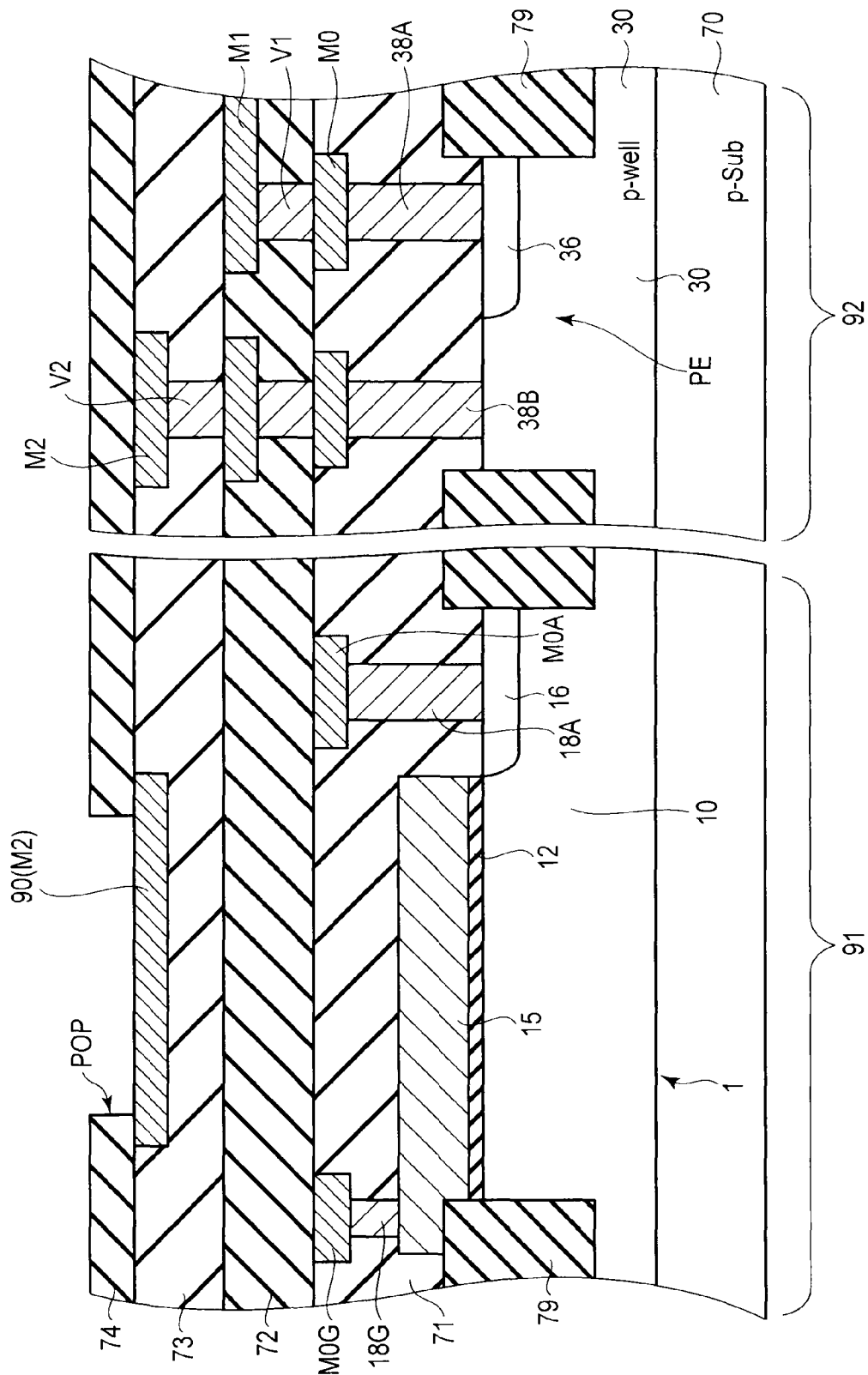
FIG. 6 is a sectional view showing an example of the structure of the semiconductor device according to the embodiment.
Figure 7:
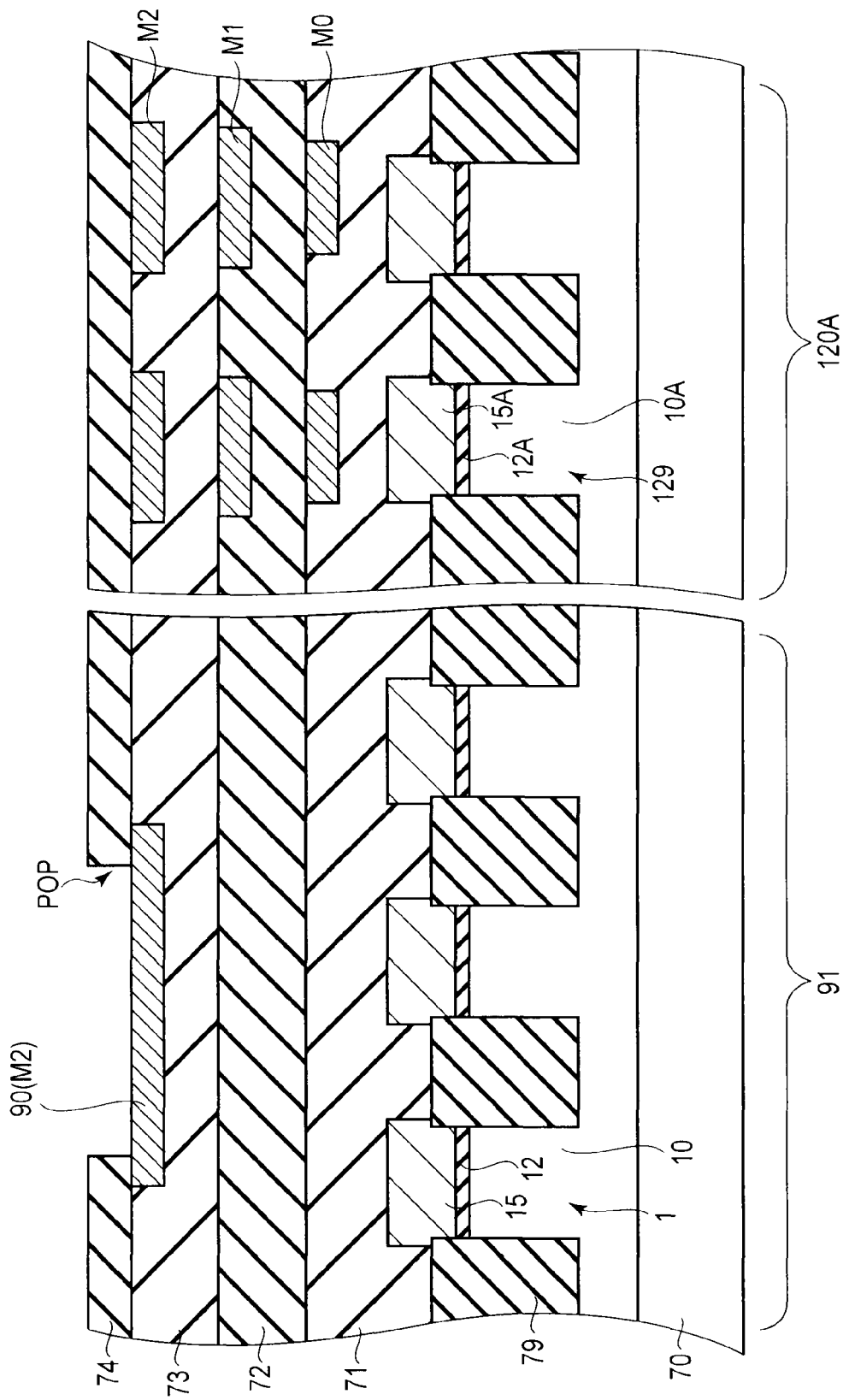
FIG. 7 is a sectional view showing an example of the structure of the semiconductor device according to the embodiment.

FIG. 6 and FIG. 7 schematically show the sectional structure of the capacitor region under the pad 90. FIG. 6 schematically shows, along line VI-VI of FIG. 5, the sectional structures of the capacitor region 91 and the capacitor 1 that extend along the direction parallel to the side of the semiconductor chip 70 (the pad arrangement direction). FIG. 7 schematically shows, along line VII-VII of FIG. 5, the sectional structures of the capacitor region 91 and the capacitor 1 that extend along the direction perpendicular to the side of the semiconductor chip 70 (the direction that intersects with the pad arrangement direction).

In FIG. 6, the sectional structure of the protection element region 92 is also shown. In FIG. 7, the sectional structure of the charge pump region 120A is also shown.

As shown in FIG. 5, the upper surface of the pad 90 is exposed by an opening POP formed in the insulator. The opening POP formed in the insulator to expose the upper surface of the pad is hereinafter referred to as a pad opening POP. The pad 90 is located at the third interconnect level from the side of the semiconductor substrate 70. A wire is attached to the part where the pad is exposed.

Capacitors $1_1$, $1_2$, and $1_3$ are provided in one capacitor region 91. Although the three capacitors $1_1$, $1_2$, and $1_3$ are shown in FIG. 5, the present embodiment is not limited to this. However, the number of capacitors provided in the capacitor region 91 is preferably two or more.

The capacitors $1_1$, $1_2$, and $1_3$ are laid out in the capacitor region 91 adjacently in, for example, the direction intersects with the pad arrangement direction (e.g., a direction where the pad 90 is arranged in the right side of FIG. 3 or a direction where the pad 90 is arranged in the lower side of FIG. 3) at regular intervals. The capacitors $1_1$, $1_2$, and $1_3$ may be laid out in the capacitor region 91 adjacently in the direction parallel to the pad arrangement direction. The capacitors $1_1$, $1_2$, and $1_3$ are hereinafter simply referred to as the capacitor 1 when not distinguished from one another.

As shown in FIG. 5 to FIG. 7, the capacitor 1 includes a semiconductor region 10, an insulating film 12, and an electrode 15. The capacitor 1 is, for example, a MOS capacitor.

The semiconductor region 10 is partitioned in the semiconductor substrate (chip) 70 in the capacitor region 91 for the capacitors $1_1$, $1_2$, and $1_3$ by an insulating film 79 formed in the semiconductor substrate 70. The insulating film 79 has a shallow trench isolation (STI) structure. The semiconductor region 10 extends, for example, along the pad arrangement direction. The semiconductor region 10 is used as one electrode (capacitor electrode) of the capacitor 1 by the formation of a channel in the semiconductor region 10 when the capacitor 1 is driven.

The semiconductor region 10 is a well region that includes a donor and an acceptor, or may be an n-type well region or a p-type well region.

The insulating film 12 is provided on the semiconductor region 10. The insulating film 12 is hereinafter referred to as a capacitor insulating film 12.

The electrode 15 is provided on the capacitor insulating film 12. The electrode 15 faces the semiconductor region 10 across the capacitor insulating film 12. A capacitance of the capacitor 1 is formed in the part where the semiconductor region 10 and the electrode 15 face each other across the insulating film 12. The electrode 15 is used as the other electrode of the capacitor 1. The electrode 15 is hereinafter referred to as a capacitor electrode 15 or a gate electrode 15.

The capacitor electrode 15 extends along the same direction as the extending direction of the semiconductor region, that is, along the pad arrangement direction.

In the extending direction (longitudinal direction) of the capacitor electrode, the dimension of each capacitor 1 is greater than the dimension of the opening POP. In a direction (width direction) that intersects the extending direction of the capacitor electrode, the dimension of each capacitor is smaller than the dimension of the opening POP.

The relation between the extending direction of the semiconductor region 10/capacitor electrode 15 and the pad arrangement direction (the side of the insulator) shown here is one example. For example, the semiconductor region 10 and the capacitor electrode 15 may extend in the direction that intersects with the pad arrangement direction.

Figure 8:
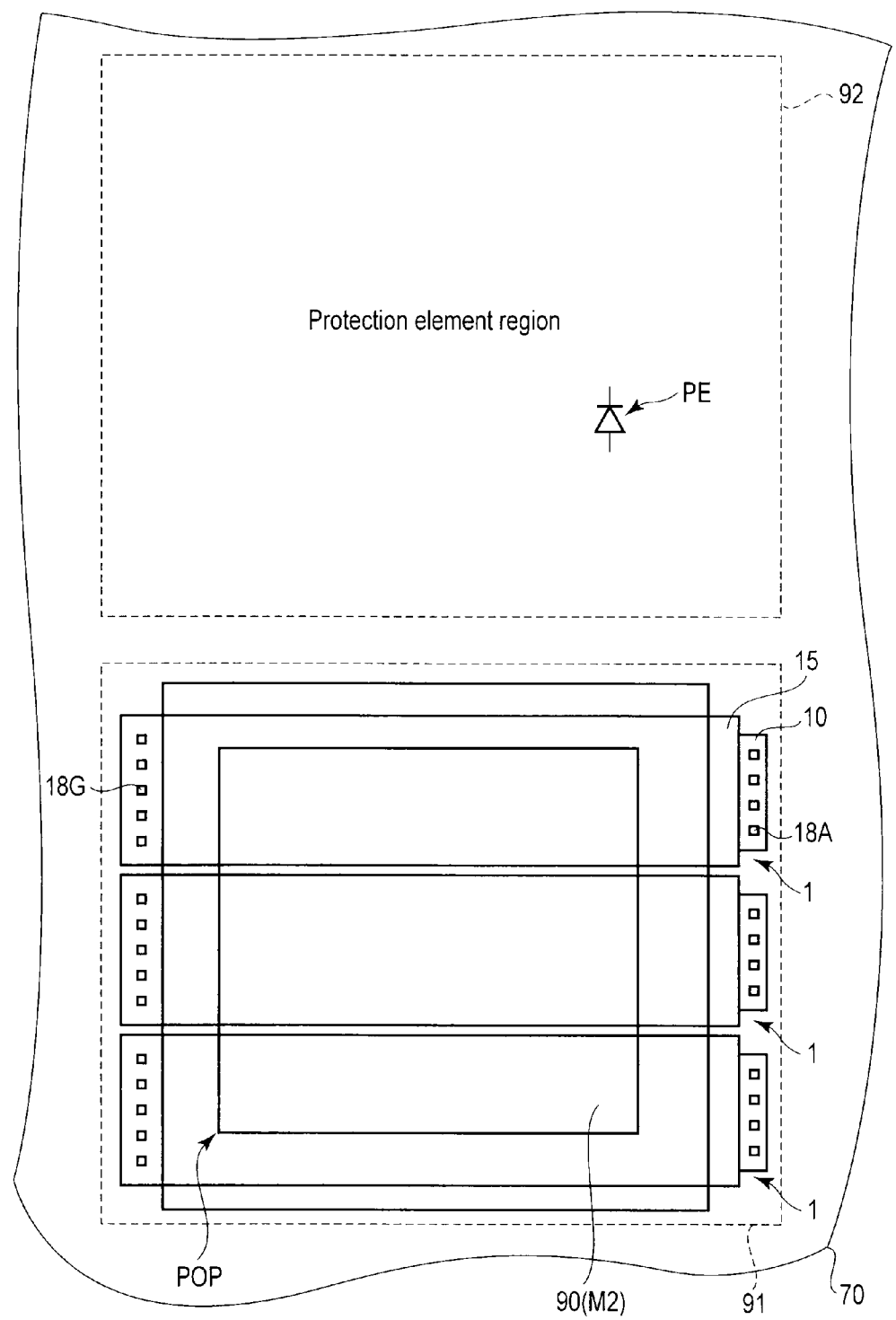
FIG. 8 is a plan view showing an example of the layout of the semiconductor device according to the embodiment.

FIG. 8 is a plan view showing an example of the layout of the capacitor region 91 and the protection element region 92. As shown in FIG. 8, a contact 18A disposed at one edge of the semiconductor region 10 may be disposed in a direction that intersects with the direction in which the protection element region 92 is disposed. Similarly, a contact 18G disposed at one end of the capacitor electrode 15 may be disposed in a direction that intersects with the direction in which the protection element region 92 is disposed. The dimension of the capacitor 1 along the direction (the extending direction of the capacitor electrode) in which contacts 18A and 18G are disposed is greater. Thus, contacts 18A and 18G are disposed in the direction that intersects with the direction in which the protection element region 92 is disposed, such that the distance between the pad 90 (capacitor region 91) and the protection element region 92 can be shorter, and the chip area can be smaller.

Figure 9:
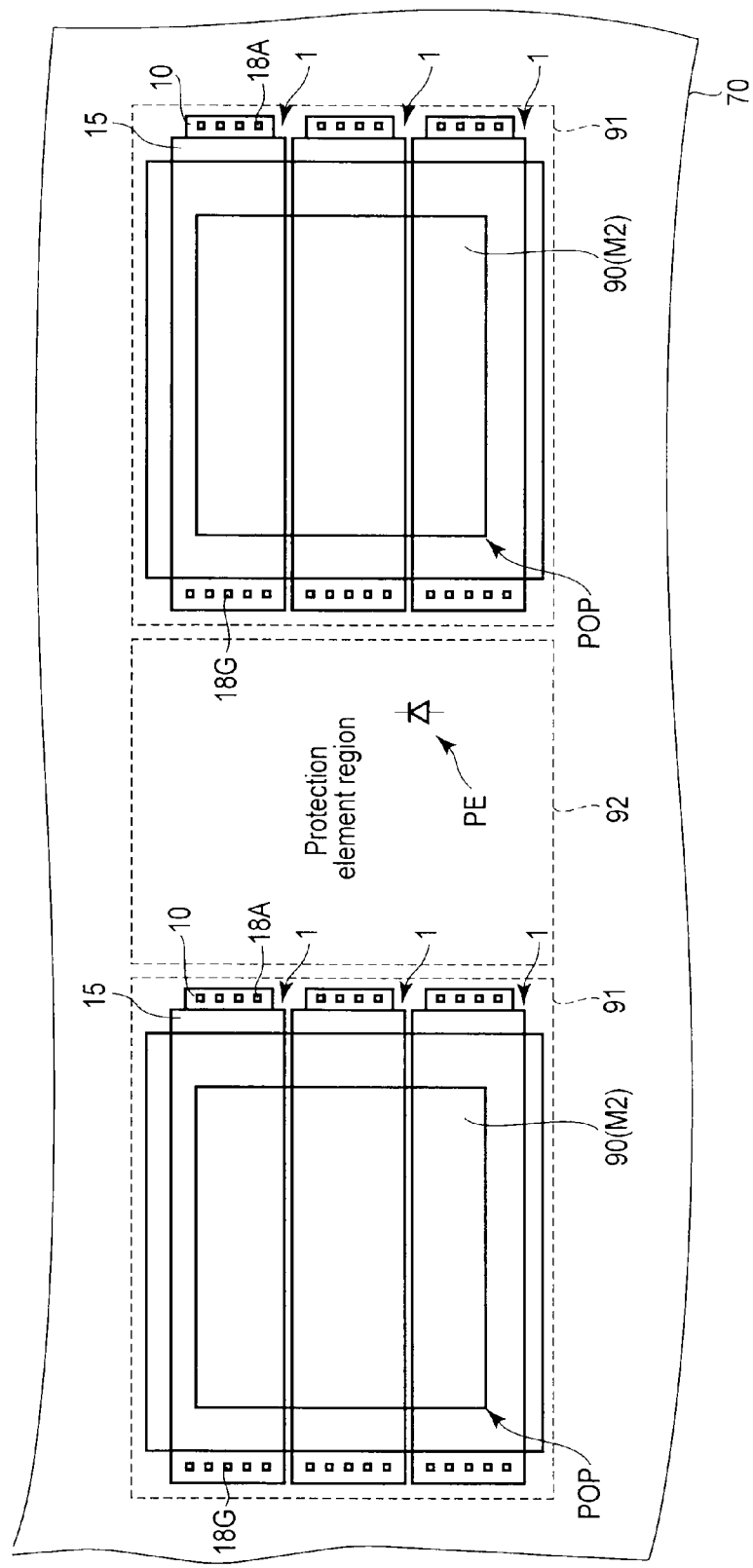
FIG. 9 is a plan view showing an example of the layout of the semiconductor device according to the embodiment.

FIG. 9 is a plan view showing an example of the layout of the capacitor region 91 and the protection element region 92. As shown in FIG. 9, contact 18A connected to one end of the semiconductor region 10 may be disposed on the side adjacent to the protection element region 92. Similarly, contact 18G connected to one end of the capacitor electrode 15 may be disposed on the side adjacent to the protection element region 92. A voltage Vcc may be applied to semiconductor regions of contact 18G and an ESD protection element PE. In this case, if contact 18G is disposed on the side of the protection element region 92, forming interconnects is easier, and the interconnect layout can be simpler.

As shown in FIG. 6, one end of the capacitor electrode 15 covers the upper surface of the isolation insulating film 79 in the pad arrangement direction (the extending direction of the capacitor electrode). On the other hand, the other end of the capacitor electrode 15 does not cover the isolation insulating film. Therefore, at the other end of the capacitor electrode 15, the upper surface of the semiconductor region 10 is exposed, and a region (contact formation region) for forming a contact in the semiconductor region 10 is secured. As shown in FIG. 7, in the direction that intersects with the pad arrangement direction, the end of the capacitor electrode 15 may cover the upper surface of the isolation insulating film 79. This allows a further increase in the capacitance of the capacitor 1.

In the example shown in FIG. 6 and FIG. 7, the capacitor electrode 15 is made of a conductor having a single-layer structure for simplicity. However, when the capacitor 1 is formed in the same process as the memory region, the capacitor electrode 15 may have a structure in which two electrode layers are stacked across an insulating film having an opening through which the two electrode layers are electrically connected to each other. That is, the capacitor electrode 15 has the same double-layer gate electrode structure as those of the gate electrode 3B and 5B of select transistors ST1 and ST2 shown in FIG. 4.

A diffusion layer 16 is provided in the semiconductor region 10. Contact 18A is provided on the diffusion layer 16. The impurity concentration of the diffusion layer 16 is set to be higher than the impurity concentration of the semiconductor region 10. Thus, at least one contact 18A is connected to one end of the semiconductor region 10.

Contact 18A is embedded in a contact hole of the interlayer insulating film 71. Contact 18A is connected to, for example, a metal layer M0A. Metal layer M0A is located at the first interconnect level from the substrate side.

At least one contact 18G is connected to the capacitor electrode 15. Contact 18G is provided at the end of the capacitor electrode 15 opposite to the side where contact 18A is provided. Contact 18G is embedded in a contact hole of the interlayer insulating film 71, and is connected to, for example, a metal layer M0G.

The capacitor 1 is driven by setting a potential difference between contacts 18A and 18G. When the semiconductor region 10 is a p-type semiconductor region, a channel is formed in the semiconductor region 10 under the capacitor electrode 15 during the driving of the capacitor 1, and the formed channel functions as an electrode of the capacitor 1. When the semiconductor region 10 is an n-type semiconductor region, the semiconductor region 10 functions as an electrode of the capacitor 1.

The capacitor 1 and contacts 18A and 18G connected thereto are covered with the interlayer insulating films 71, 72, and 73 and the insulator 74.

In the semiconductor device according to the present embodiment, contacts 18A and 18G connected to the capacitor 1 are laid out at positions that do not vertically overlap the pad opening POP in the direction perpendicular to the surface of the substrate (film stacking direction). Contact 18G is laid out, for example, above the isolation insulating film 79 in the direction perpendicular to the surface of the substrate. For example, the insulating layer (insulator) 74 is provided above contacts 18A and 18G.

Similarly to contacts 18A and 18G, metal layers M0A and M0G connected to contacts 18A and 18G are also laid out at positions that do not vertically overlap the pad opening POP in the direction perpendicular to the surface of the substrate. The center of the capacitor electrode 15 is laid out under the pad opening POP. In the pad opening POP, the insulator 74 is removed from the upper surface of the pad 90, and the surface of the pad is exposed.

It should be understood that if contacts 18A and 18G and the metal layers are provided at the positions that do not vertically overlap the pad opening POP, contacts 18A and 18G may be connected to the metal layers located at a higher interconnect level than metal layers M0A and M0G depending on the connection between the capacitor 1 and other circuits.

In the capacitor region 91, no metal layer as an interconnect is provided between the pad opening POP and the capacitor electrode 15 in the direction perpendicular to the surface of the substrate. The reason is to avoid the breakage (opening) of the interconnects or contacts under the pad 90 due to mechanical stress produced during bonding or during a test. It is also possible to avoid, for example, a short circuit caused by erroneous contact of a bonding wire with a contact V2 or metal layer M1 because of the bonding wire penetrating the third interlayer insulating film 73 under the pad 90.

The capacitors $1_1$, $1_2$, and $1_3$ are provided in the capacitor region 91 to satisfy a rule of coverage. Here, the coverage in the capacitor region 91 means an allowable range (an upper limit and a lower limit) that allows a pattern to be processed in a predetermined area in the substrate. That is, the coverage means the ratio (rate, area) of the semiconductor region 10 to other regions (the isolation region 79) in the region 91 or the ratio (rate) of the gate electrode 15 to other members (the interlayer insulating film 71 located at the same interconnect level as the capacitor electrode 15) when the capacitor region 91 is viewed from the direction perpendicular to the surface of the substrate. The coverage is adjusted to a value by adjusting the dimension of the isolation insulating film 79 or the dimension of the capacitor electrode 15.

Here, the capacitance of the capacitor can be increased by increasing the ratio (this may hereinafter be simply referred to as coverage) of the semiconductor region 10 and the capacitor electrode 15 in the capacitor region 91 to the upper limit of the allowable range. However, when the components of the capacitor in the capacitor region 91 are increased in size, it is often difficult to cover the entire region under the pad 90 with the semiconductor region 10 or the capacitor electrode 15. Therefore, the semiconductor region 10 or the capacitor electrode 15 has to be partly cut in the region under the pad 90. When, for example, contact 18G is disposed in the region under (region immediately under) the pad 90, the interconnects, for example, are opened or short-circuited by mechanical stress produced during bonding or during a test as described above. Thus, in the present embodiment, the positions to form contact 18G and the like are shifted from the region under the pad 90 while the rule of the coverage in the capacitor region 91 is satisfied.

As shown in FIG. 3 and FIG. 6, the protection element region 92 is provided in the semiconductor substrate 70 to be adjacent to the capacitor region 91.

For example, a diode PE or a capacitor (not shown) is provided as, for example, the ESD protection element PE in the protection element region 92. The diode PE includes a semiconductor region 30 as an anode, and a semiconductor region 36 as a cathode. The ESD protection element PE is not exclusively the diode and may be, for example, a MOS transistor. For example, the capacitor 1 provided in the capacitor region 91 can be used as the capacitor for the protection element provided in the protection element region 92. This makes it possible to locate the capacitor 1 and the ESD protection element PE in proximity to each other, and simplify the circuit layout.

The semiconductor region 30 as the anode is a p-type well region 30. The semiconductor region 36 as the cathode is an n-type diffusion layer 36. The n-type diffusion layer 36 is provided in the p-type well region 30.

A contact 38B is connected to the contact formation region of the p-type well region 30.

The p-type well region 30 as the anode is connected to metal layer M1 via contact 38B, metal layer M0, and via plug V1. The p-type well region 30 is connected to metal layer M2 via via plug V2 connected to metal layer M1. A contact 38A is connected to the contact formation region of the n-type diffusion layer 36. Contact 38A is, for example, connected to metal layer M1 via metal layer M0 and via plug V1.

In order to reduce parasitic resistance produced between contacts 38A and 38B and the contact formation region, a high-concentration impurity diffusion layer or a silicide layer may be provided in the p-type well region 30 and the n-type diffusion layer 36 as a contact region.

As shown in FIG. 3 and FIG. 6, when the protection element region 92 is adjacent to the capacitor region 91, the semiconductor region 10 of the capacitor 1 is preferably a p-type well region. The reason is to reduce the effect of the ESD protection element on the characteristics of the diode PE and to enhance layout efficiency.

As shown in FIG. 3 and FIG. 7, the charge pump region 120A, for example, is provided in the semiconductor substrate 70 to be adjacent to, for example, the region where the sense amplifier 108 is provided. The capacitors 129 for forming the charge pump are provided in the charge pump region 120A.

The capacitor 129 for the charge pump is a MOS capacitor similarly to the capacitor 1 in the capacitor region 91, and includes, for example, a semiconductor region (well region) 10A, an insulating film (capacitor insulating film) 12A, and a capacitor electrode 15A.

The semiconductor region 10A is a p- or n-type well region. The capacitor insulating film 12A is provided on the semiconductor region 10A. The capacitor electrode 15A is provided on the capacitor insulating film 12A. Contacts (not shown) are connected to the semiconductor region 10A and the capacitor electrode 15A, respectively. The sectional structure of the capacitor 129 along the extending direction of the semiconductor region 10A is substantially similar to the sectional structure of the capacitor 1 shown in FIG. 6, and is therefore not shown.

The coverage of the capacitor 129 in the charge pump region 120A is, for example, equal to or more than the coverage of the capacitor 1 in the capacitor region 91. Here, in the charge pump region 120A, a large capacitor 129 may be provided to produce a high voltage. On the other hand, a relatively small capacitor 129 may be provided to produce a low voltage. Therefore, the capacitors 129 having various sizes are present in the charge pump region 120A. Here, the capacitance of the large capacitor for producing a high voltage (this may hereinafter be simply referred to as a large capacitor 129 in the charge pump region 120A) is often highest. That is, the coverage of the large capacitor 129 in the charge pump region 120A is increased to the upper limit of the allowable range.

As the capacitor 1 in the capacitor region 91 is often used for power supply stabilization, the capacitance of the capacitor 1 is often high. Thus, the coverage of the large capacitor 129 in the charge pump region 120A may be the same as the coverage of the capacitor 1 in the capacitor region 91.

That is, the capacitors $1_1$, $1_2$, and $1_3$ may be formed in one capacitor region 91 so that the coverage of the large capacitor 129 in the charge pump region 120A is equal to or more than the coverage of the capacitor 1 in the capacitor region 91.

In the semiconductor device (e.g., a flash memory) according to the present embodiment, the capacitor region 91 in which the capacitors 1 are arranged is provided under the pad 90 and the pad opening POP provided in the insulator. The capacitors 1 are formed in the capacitor region 91 under the pad opening POP to satisfy the rule of the coverage.

According to the present embodiment, instead of dummy patterns, the capacitors 1 are provided on the semiconductor substrate (semiconductor chip) under the pad opening to which mechanical stress is applied during the manufacturing process of the semiconductor device. Although the capacitor electrode 15 of the capacitor 1 is located under the pad 90, the distance between the pad 90 and the capacitor electrode 15 is greater than the distance between the pad 90 and interconnect M0G in the first (lowermost) interconnect level. Therefore, the region under the pad 90 can be effectively used as an element formation region without the deterioration of the characteristics of the semiconductor device and the deterioration in production yield. Thus, the semiconductor device according to the present embodiment enables higher integration of the semiconductor substrate.

A planar pattern such as the electrode of the capacitor is disposed under the pad to satisfy the rule of the coverage. As a result, the pattern of the capacitor absorbs damage from mechanical stress such as mechanical stress produced during bonding. Accordingly, the semiconductor device according to the present embodiment can maintain its tolerance over a mechanical stress.

In the semiconductor device according to the present embodiment, contacts 18A and 18G and interconnects (metal layers) M0A and M0G are connected to the semiconductor region 10 and the capacitor electrode 15 included in the capacitor 1, respectively. Contacts 18A and 18G and interconnects M0A and M0G are laid out without vertically overlapping the pad opening POP in the direction perpendicular to the surface of the substrate.

Here, mechanical stress may be applied to the part under the pad 90 during the bonding to the pad 90. However, this structure inhibits high stress that may destroy components from being directly applied to contacts 18A and 18G and interconnects M0A and M0G. This makes it possible to inhibit structural damage such as cracks from being caused in the capacitor 1 and to inhibit the deterioration in production yield of the semiconductor device.

The coverages of the capacitor electrode 15 and the isolation insulating film 79 are adjusted to correspond to the areas of the pad 90 and the pad opening POP. In this case, the number of the capacitors 1 in one capacitor region can be increased or decreased. In order to adjust the coverage, the ratio between the semiconductor region 10 and the isolation insulating film 79 may be changed or the ratio between the capacitor electrode 15 and other regions (the interlayer insulating film 71 located at the same interconnect level as the capacitor electrode 15) may be changed. Thus, even if the capacitor region 91 is provided under the pad 90 as in the present embodiment, there is no need for considerable changes in the manufacturing process and layout of the semiconductor device.

As described above, according to the present embodiment, a highly integrated semiconductor device can be provided.

(2) Second Embodiment

A semiconductor device according to the second embodiment is described with reference to FIG. 10 and FIG. 11.

Figure 10:
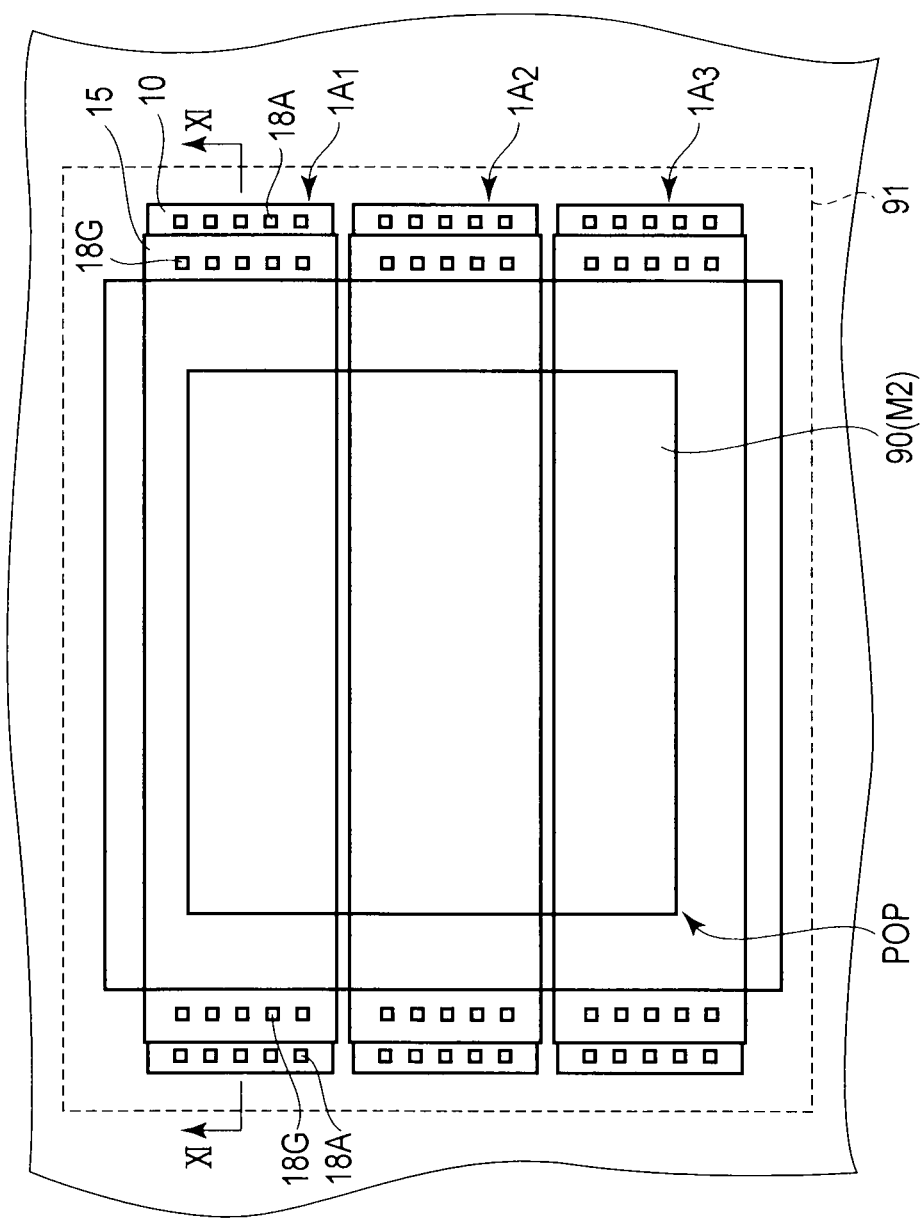
FIG. 10 is a plan view showing an example of the layout of the semiconductor device according to an embodiment.

FIG. 10 schematically shows the planar layout of a capacitor region 91 provided under a pad 90 in the semiconductor device according to the second embodiment. FIG. 11 schematically shows, along line XI-XI of FIG. 10, the sectional structure of a capacitor in the semiconductor device according to the second embodiment.

Figure 11:
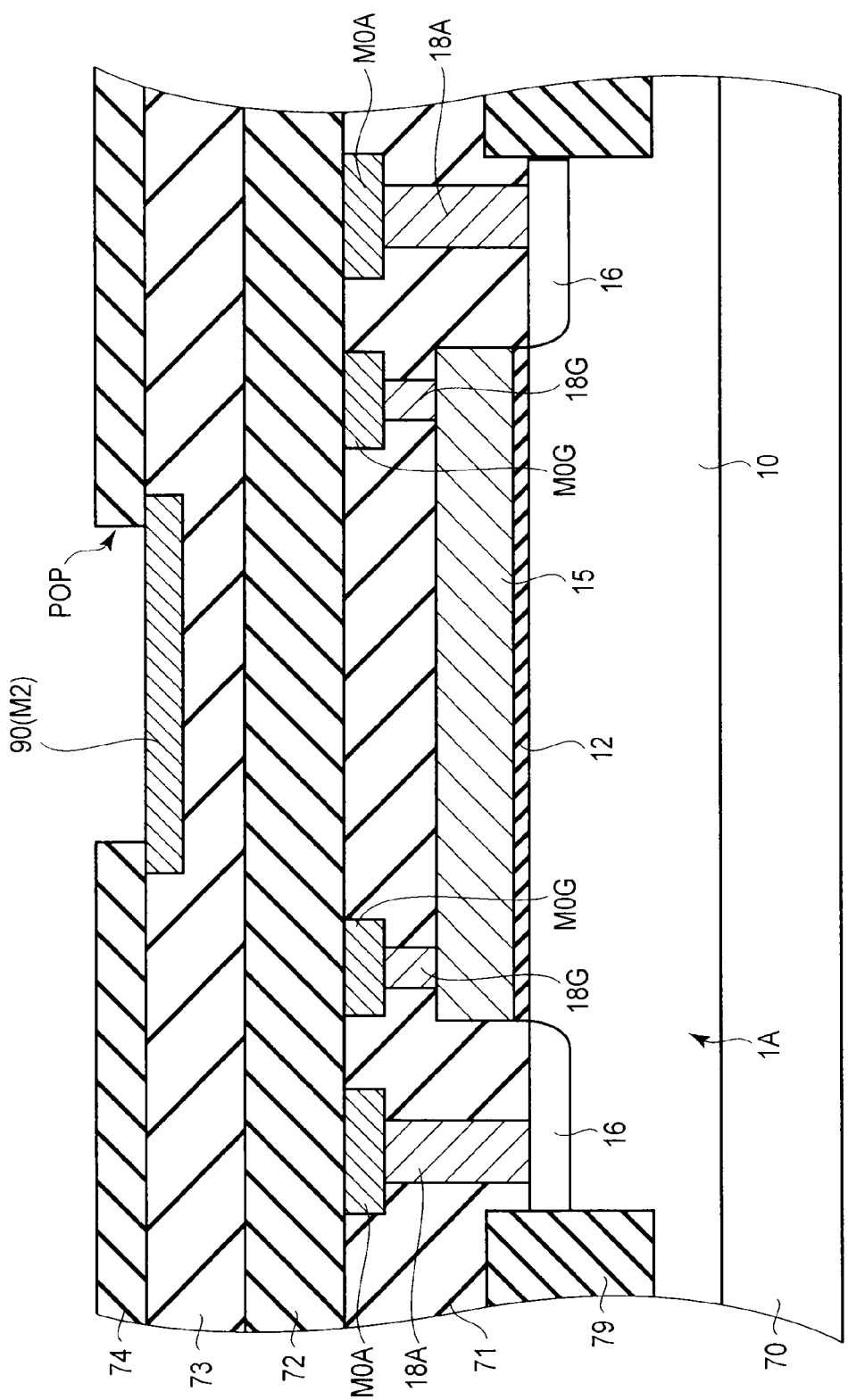
FIG. 11 is a sectional view showing an example of the structure of the semiconductor device according to the embodiment.

As shown in FIG. 10 and FIG. 11, in the semiconductor device according to the second embodiment, contacts 18A are respectively provided at both ends of a semiconductor region 10 in the extending direction (longitudinal direction, first direction) of a capacitor 1A. Contacts 18A provided at one end of the semiconductor region 10 and the other face each other on the semiconductor region 10. Contacts 18G are also provided at both ends of a capacitor electrode 15 in the extending direction of the capacitor 1A. Contacts 18G provided at one end of the capacitor electrode 15 and the other face each other on the capacitor electrode 15.

Contacts 18A provided at both ends of the semiconductor region 10 are laid out on the semiconductor region 10 without vertically overlapping a pad opening POP in a direction perpendicular to the surface of a substrate. Contacts 18G provided at both ends of the capacitor electrode 15 are also laid out on the capacitor electrode 15 without vertically overlapping the pad opening POP.

If the area of the pad 90 increases, the opening area of the pad opening POP also increases. When contacts 18A and 18G are laid out at positions that do not vertically overlap the pad opening POP, the dimensions of the semiconductor region 10 and the capacitor electrode 15 also increase. The area increase of the semiconductor region 10 and the capacitor electrode 15 increases the resistances of the semiconductor region 10 and the capacitor electrode 15 and the resistance of a channel formed in the semiconductor region 10 during the driving of the capacitor 1A. As a result, the function of the capacitor as a stabilization capacitor under the pad may deteriorate.

In the present embodiment, contacts 18A and 18G are respectively provided at both ends of the semiconductor region 10 and the capacitor electrode 15 in the extending direction of components. Therefore, even if the area of the capacitor 1A increases, a voltage can be relatively uniformly applied to the semiconductor region 10 and the capacitor electrode 15. Thus, the semiconductor device according to the present embodiment can lessen the deterioration of the characteristics of the capacitor 1A resulting from the increase in resistance.

Moreover, contacts 18A and 18G are respectively provided at both ends of the semiconductor region 10 and the capacitor electrode 15, such that the degree of freedom in designing can be improved in the interconnect layout for connecting the capacitor 1A to other circuits.

As described above, according to the semiconductor device of the second embodiment, advantages similar to those in the first embodiment can be obtained, and the deterioration of the characteristics of the capacitor provided under the pad 90 can be inhibited.

(3) Third Embodiment

A semiconductor device according to the third embodiment is described with reference to FIG. 12 and FIG. 13.

Figure 12:
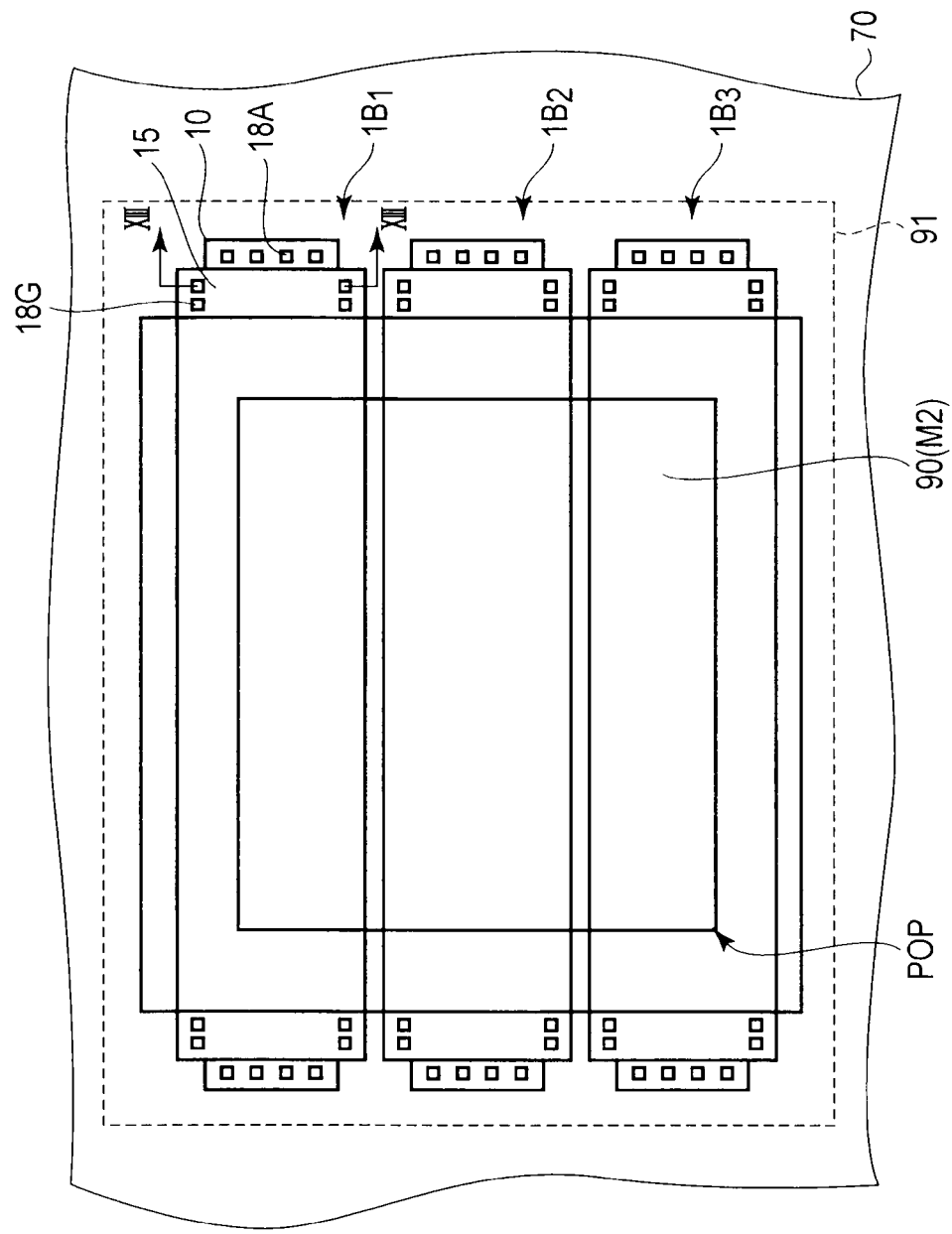
FIG. 12 is a plan view showing an example of the layout of the semiconductor device according to an embodiment.

FIG. 12 schematically shows the planar layout of a capacitor region 91 provided under a pad 90 in the semiconductor device according to the third embodiment. FIG. 13 schematically shows, along line XIII-XIII of FIG. 12, the sectional structure of a capacitor 1B in the semiconductor device according to the third embodiment.

As shown in FIG. 12 and FIG. 13, in the semiconductor device according to the third embodiment, contacts 18A connected to a semiconductor region 10 of the capacitor 1B are laid out at the end of the extending direction (longitudinal direction) of the semiconductor region 10. On the other hand, contacts 18G connected to a capacitor electrode 15 of the capacitor 1B are laid out on the capacitor electrode 15 in a direction (the width direction of the semiconductor region 10, second direction) that intersects with the extending direction of the semiconductor region 10 (pad arrangement direction).

In the width direction of the semiconductor region 10 (e.g., the direction that intersects with the pad arrangement direction), the dimension (width) of the capacitor electrode 15 is greater than the dimension (width) of the semiconductor region 10.

Contact 18G is disposed, for example, above an isolation insulating film 79 adjacent to the semiconductor region 10 in the width direction of the semiconductor region 10.

As in the present embodiment, even when contact 18G is connected to the end of the capacitor electrode 15 in the width direction of the semiconductor region 10, contact 18G and a metal layer M0G connected thereto are provided on the capacitor electrode 15 at positions that do not vertically overlap a pad opening POP.

Moreover, contact 18G is disposed at the position that does not vertically overlap the semiconductor region 10 in a direction perpendicular to the surface of a substrate. This makes it possible to prevent contact 18G from penetrating the capacitor electrode 15 and contacting the semiconductor region 10 as a result of a process failure such as overetching during the formation of a contact hole.

Consequently, according to the semiconductor device of the third embodiment, advantages similar to those in the first and second embodiments can be obtained, and the deterioration in production yield of the semiconductor device can be inhibited.

(4) Fourth Embodiment

A semiconductor device according to the fourth embodiment is described with reference to FIG. 14 and FIG. 15.

Figure 14:
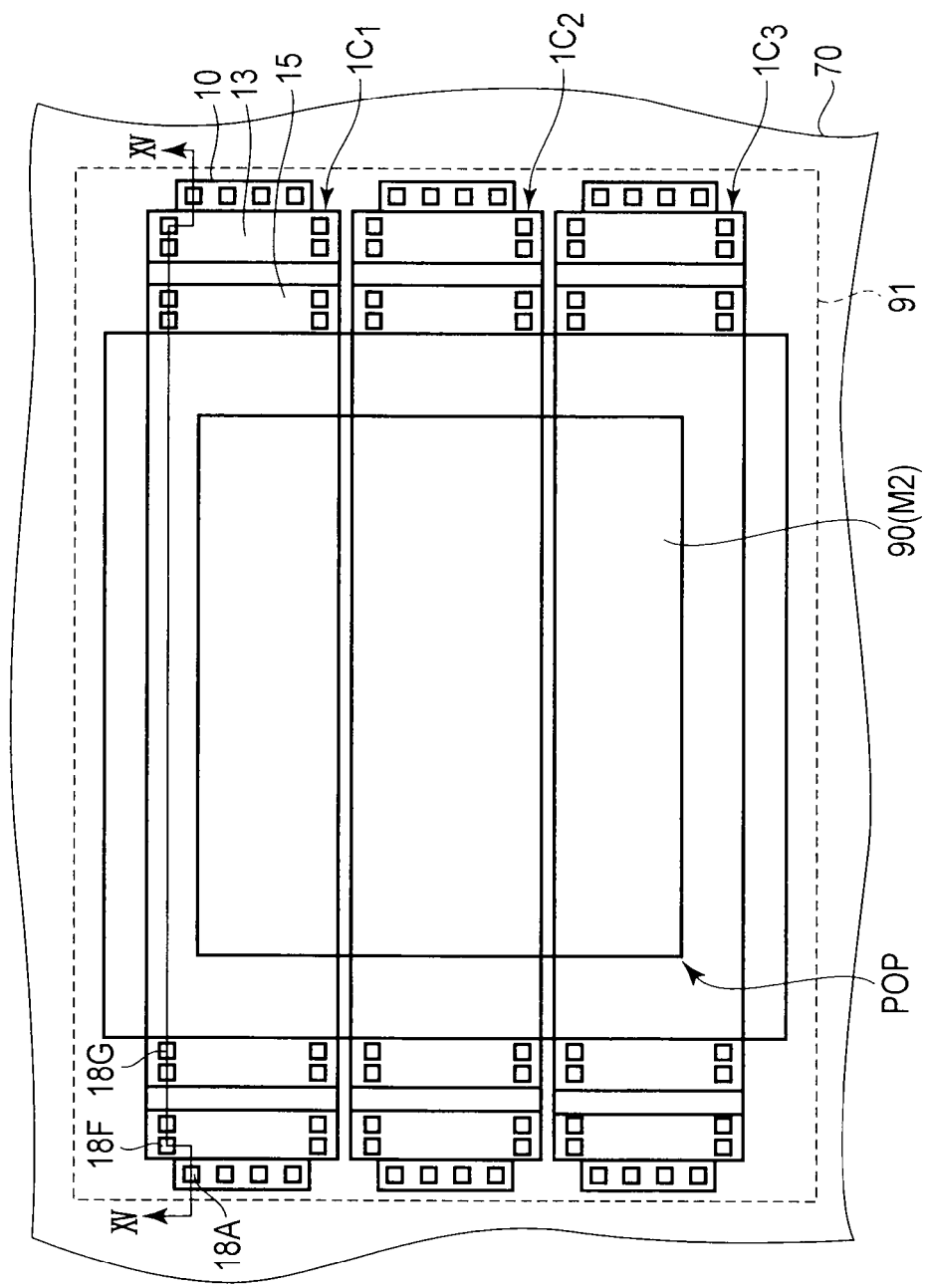
FIG. 14 is a plan view showing an example of the layout of the semiconductor device according to an embodiment.

FIG. 14 schematically shows the planar layout of a capacitor region 91 provided under a pad 90 in the semiconductor device according to the fourth embodiment. FIG. 15 schematically shows, along line XV-XV of FIG. 14, the sectional structure of a capacitor in the semiconductor device according to the fourth embodiment.

As has been described with reference to FIG. 4, in a flash memory, a memory cell transistor MT has a gate structure in which a floating gate electrode (charge storage layer) 3A and a control gate electrode 5A are stacked across an intergate insulating film 4A.

Figure 15:
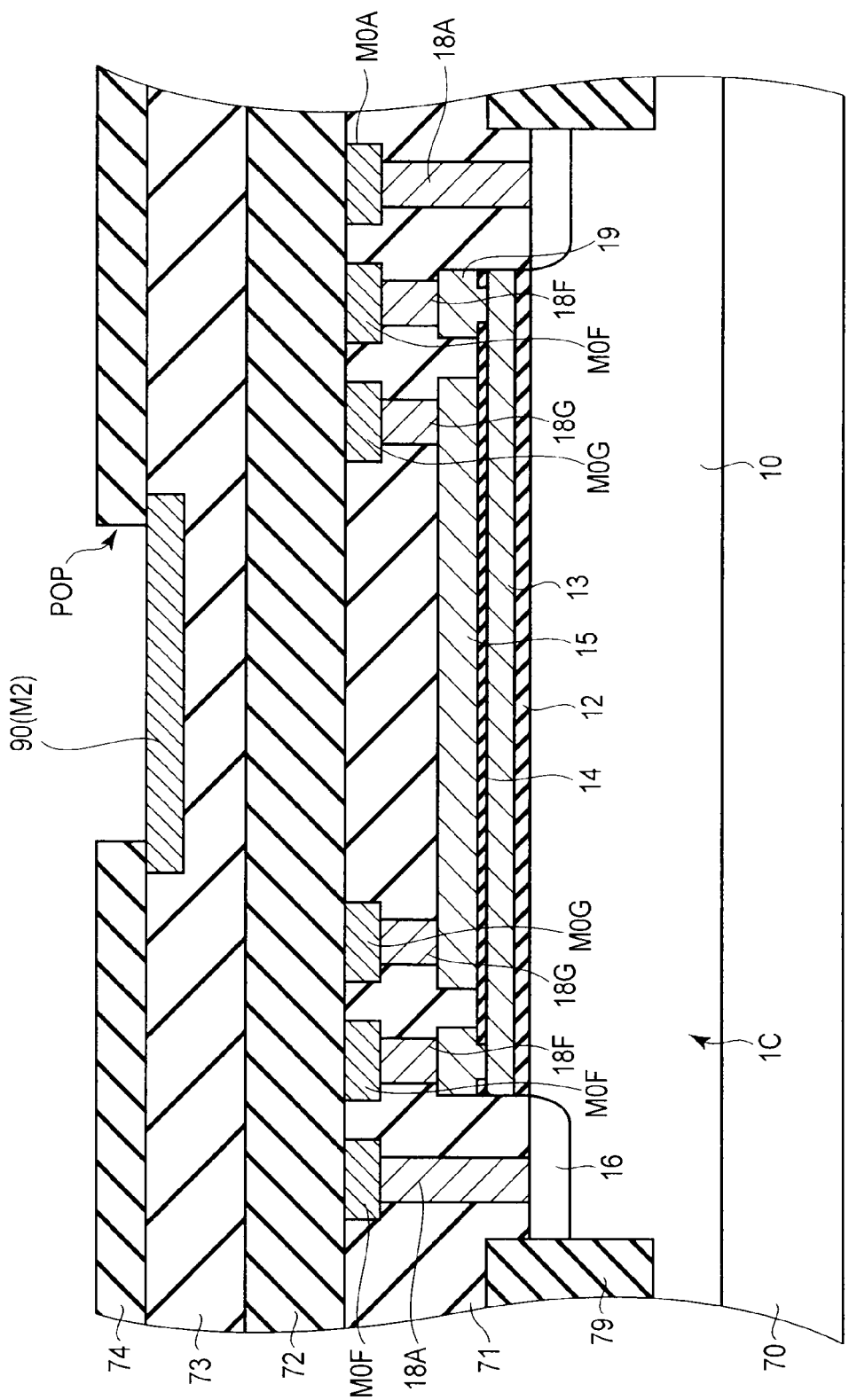
FIG. 15 is a sectional view showing an example of the structure of the semiconductor device according to the embodiment.

Thus, as shown in FIG. 14 and FIG. 15, a capacitor 1C provided in the capacitor region 91 includes a stack substantially similar to the stack gate structure of the memory cell transistor MT, and two conductors stacked across an insulating film 14 may be used as electrodes 13 and 15 of the capacitor 1A.

As shown in FIG. 15, a first capacitor insulating film 12 is provided on the semiconductor region 10. The first capacitor electrode 13 is provided on the first capacitor insulating film 12. The first capacitor electrode 13 is made in the same process as and made of the same material as the floating gate electrode 3A of the memory cell transistor MT. The first capacitor electrode 13 and the floating gate electrode 3A are located at the same layer (height). The capacitor electrode 13 is made of, for example, conductive polysilicon. The capacitor electrode 13 is connected to a contact 18F and a metal layer M0F via a dummy layer 19. The dummy layer 19 is electrically connected to the capacitor electrode 13 via an opening formed in the insulating film 14.

Contact 18F and the dummy layer 19 are connected to one end of the capacitor electrode 13 and the other in the extending direction of the capacitor electrode 13.

A capacitance (first capacitance) is formed in the part where the capacitor electrode 13 and the semiconductor region 10 face each other across the first capacitor insulating film 12. The semiconductor region 10 and the capacitor electrode 13 facing each other across the insulating film 12 form a MOS capacitor.

The second capacitor insulating film 14 is provided on the first capacitor electrode 13. The second capacitor insulating film 14 is formed in the same process as the intergate insulating film 4A of the memory cell transistor MT. The capacitor insulating film 14 is of the same material (e.g., an ONO film) as the intergate insulating film 4A. The capacitor insulating film 14 and the intergate insulating film 4A are located at about the same layer (height). The second capacitor electrode 15 is provided on the capacitor insulating film 14. The second capacitor electrode 15 and the dummy layer 19 are made in the same process as and made of the same material as the control gate electrode 5A of the memory cell transistor MT. The second capacitor electrode 15 and the dummy layer 19 are also located at about the same layer (height) as the control gate electrode 5A. A slit is provided between the second capacitor electrode 15 and the dummy layer 19. The dummy layer 19 is separate from the second capacitor electrode 15.

In the extending direction of the capacitor electrode 15, a contact 18G and a metal layer M0G are connected to one end of the second capacitor electrode 15 and the other.

In FIG. 15, in order to show the configuration of the capacitor of this example, contacts 18F and 18G connected to the capacitor electrodes 13 and 15 are shown to be disposed above the semiconductor region 10. However, to prevent contact between contacts 18F and 18G and the semiconductor region 10, contacts 18F and 18G are preferably laid out at positions that do not vertically overlap the semiconductor region 10, as shown in FIG. 14.

Contacts 18A, 18F, and 18G may be connected to the semiconductor region 10 and the electrodes 13 and 15 on one end alone, as in the example shown in FIG. 6.

A capacitance (second capacitance) is formed in the part where the capacitor electrode 13 and the capacitor electrode 15 face each other across the capacitor insulating film 14. The two capacitor electrodes 13 and 15 facing each other across the insulating film 14 form, for example, a parallel plate capacitor. However, if the impurity concentration of the electrode 13 is low, the capacitor formed by the intervention of the capacitor insulating film 14 may be driven as the MOS capacitor.

In the semiconductor device according to the present embodiment, the stack having about the same configuration as that of a stack gate electrode is used to form the capacitors 1C. In this case as well, the capacitors 1C are provided in the capacitor region 91 under the pad 90 so that the semiconductor region 10, the capacitor electrodes 13 and 15, and the capacitor insulating films 12 and 14 satisfy the rule of the coverage. Accordingly, the semiconductor device according to the present embodiment can maintain the tolerance over a mechanical stress to the mechanical stress applied to the part under the pad.

In the semiconductor device according to the present embodiment, contacts 18A, 18F, and 18G respectively connected to the semiconductor region 10 and the capacitor electrodes 13 and 15 are laid out at positions that do not vertically overlap a pad opening POP in a direction perpendicular to the surface of a substrate, as in the first to third embodiments. Consequently, in the semiconductor device according to the present embodiment, the destruction of the contacts and an interlayer insulating film by the mechanical stress during bonding is reduced.

According to the present embodiment, the stack having the same configuration as that of the stack gate electrode is used to form the capacitors (capacitances) in the stacking direction of the capacitor electrodes 13 and 15, such that the integration degree of the elements (capacitors) in the film stacking direction can be improved.

Thus, according to the semiconductor device of the fourth embodiment, advantages similar to those in the first to third embodiments can be obtained, and the integration of the semiconductor device can be further increased.

(5) Application Example

Application examples of the semiconductor device according to the embodiments are described with reference to FIGS. 16 and 17.

In a semiconductor device such as a flash memory, pads that vary in function and in signals to be input/output are provided.

For example, a pad (referred to as a power supply pad) to which external power supplies Vx such as a voltage Vcc and a voltage Vss are applied and a pad (referred to as an I/O pad) for inputting/outputting data are provided in the semiconductor device 9.

Also provided in the semiconductor device 9 is a pad for switching chip addresses or switching power supply specifications, a pad (referred to as an R/B pad) to which a ready/busy signal is input, or a pad such as a test pad that is not bonded. For example, the pad for switching addresses or specifications is set to a fixed potential, and the R/B pad is toggled.

As has been described in the first to fourth embodiments, the semiconductor device according to each of the embodiments is provided with the capacitors 1 under the pad 90. Taking into consideration parasitic capacitance produced between metal layer M2 as the pad 90 and the electrode 15 of the capacitor 1 is preferable to inhibit the deterioration of the operation characteristics of the semiconductor device.

For example, the capacitance of the I/O pad for high-speed data communication is preferably smaller. A pin capacitance may be prescribed for the pad.

It is therefore preferable that the capacitor 1 in the semiconductor device of the embodiments is not provided under the I/O pad or the pad for which the pin capacitance is prescribed.

Figure 16:
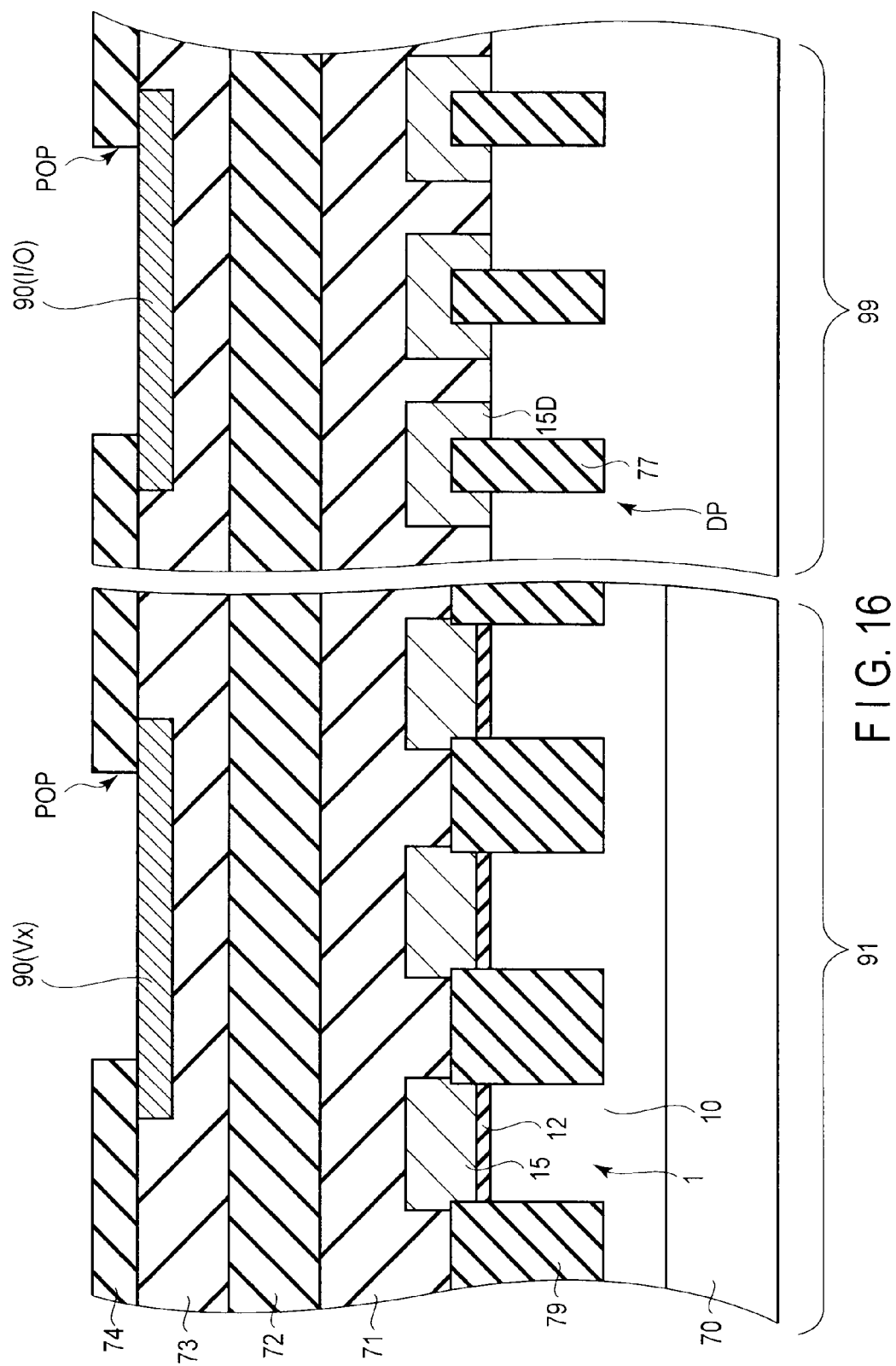
FIG. 16 is a diagram for explaining an application example.

For example, as shown in FIG. 16, a structure DP which does not have a function as an element is provided under a pad for which the pin capacitance is prescribed, such as the I/O pad 90 (I/O). The structure DP which does not have a function as an element is hereinafter referred to as a dummy pattern DP. The region 99 in which the dummy pattern DP is provided is referred to as a dummy pattern region 99.

For example, the dummy pattern DP includes an insulator 77, and a conductor 15D on the insulator 77. The insulator 77 is embedded in, for example, the semiconductor substrate 70, and the upper part of the insulator 77 protrudes from the surface of the semiconductor substrate 70. The insulator 77 has, for example, an STI structure. The insulator 77 is formed in the same process as the isolation insulating film 79.

The conductor 15D is provided on the insulator 77 to cover the upper surface and part of the side surface of the insulator 77. The conductor 15D is formed in the same process as the capacitor electrode 15.

The dummy pattern DP extends in the depth direction of FIG. 16, and has a linear planar pattern.

Thus, the dummy pattern region 99 having the dummy pattern DP is provided under the I/O pad, such that the I/O pad is hardly affected by the parasitic capacitance between the capacitor electrode and the pad. The I/O pad can satisfy the prescription of the pin capacitance. Under the pad 90 for which the pin capacitance is prescribed, the dummy pattern DP is formed such that the rule of the coverage can be satisfied and tolerance over a mechanical stress can be ensured when mechanical stress is applied to the pad.

Even if parasitic capacitance is produced between the external power supply pad 90 (Vx) and the capacitor electrode 15, the effect of the parasitic capacitance on the characteristics of the pad is small. Thus, the capacitor region 91 having the capacitors 1 may be provided under a pad having a fixed potential such as the external power supply pad 90. That is, the external power supply pad 90 is electrically connected to the capacitor 1 under the external power supply pad 90, and the capacitor 1 is used as a stabilization capacitor for a power supply.

When the capacitor 1 is provided under the external power supply pad 90 (Vx), the external power supply pad 90 (Vx) and the capacitor 1 can be connected to each other, for example, as shown in FIG. 17. Here, the external power supply pad 90 (Vx) and the capacitor electrode 17 are connected to each other via contact plug 18G, via plugs V1 and V2, and metal layers M0G and M1. In addition, the diffusion layer 16 is connected to a ground potential (ground power supply) via, for example, contact plug 18A and metal layer M0A. Accordingly, the length of the interconnect that connects the external power supply pad to the stabilization capacitor can be shorter, and interconnect resistance can be reduced. As a result, external noise can be effectively eliminated, and stable power can be supplied to the chip.

Similarly to the power supply pad 90, the capacitor region 91 may be secured under a pad set to a fixed potential, a pad for which the pin capacitance is not prescribed, or a pad that is not bonded, and the capacitors 1 may be provided in this region 91.

As described above, by taking into consideration the functions/characteristics of the pad, the region under the pad (pad opening) of the semiconductor device can be effectively used without the deterioration of the characteristics of the semiconductor device.

Consequently, according to the present embodiment, the integration degree of the semiconductor device can be improved.

[Addition]

In the embodiments described above, the NAND flash memory is shown as an example of the semiconductor integrated circuit formed in the semiconductor chip. However, the semiconductor integrated circuit is not limited thereto, and may be a flash memory having a different circuit configuration (e.g., a NOR type), may be a semiconductor memory such as a DRAM, an SRAM, an MRAM, a ReRAM, or a PCRAM, may be a logic circuit, or may be an system LSI in which a semiconductor memory and a logic circuit are mixed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor chip which includes a semiconductor integrated circuit;
a bonding pad having an upper surface of which is exposed via an opening; and
capacitors provided in a capacitor region of the semiconductor chip under the bonding pad,
contacts respectively connected to two electrodes of the capacitors are provided at positions that do not vertically overlap the opening, and
each of the capacitors includes
a semiconductor region in the capacitor region,
a first insulating film on the semiconductor region,
a first electrode on the first insulating film,
first and second contacts on one end of the semiconductor region and the other, and
third and fourth contacts on one end of the first electrode and the other.

2. The semiconductor device according to claim 1, wherein
the first and second contacts are provided on the semiconductor region to face each other in a first direction, and
the third and fourth contacts are provided on the first electrode to face each other in a second direction that intersects with the first direction.

3. The semiconductor device according to claim 1, wherein the capacitor includes
a second insulating film on the first electrode,
a second electrode on the second insulating film, and
fifth and sixth contacts on one end of the second electrode and the other.

4. The semiconductor device according to claim 3, wherein
a first capacitance is formed between the semiconductor region and the first electrode, and
a second capacitance is formed between the first electrode and the second electrode.

5. The semiconductor device comprising:
a semiconductor chip which includes a semiconductor integrated circuit;
a bonding pad having an upper surface of which is exposed via an opening; and
capacitors provided in a capacitor region of the semiconductor chip under the bonding pad,
contacts respectively connected to two electrodes of the capacitors are provided at positions that do not vertically overlap the opening,
the semiconductor chip includes a protection element region adjacent to the capacitor region, and
the capacitor region and the protection element region include p-type well regions.

6. A semiconductor device comprising:
a semiconductor chip which includes a semiconductor integrated circuit;
a bonding pad having an upper surface of which is exposed via an opening; and
capacitors provided in a capacitor region of the semiconductor chip under the bonding pad,
contacts respectively connected to two electrodes of the capacitors are provided at positions that do not vertically overlap the opening, and
the semiconductor integrated circuit includes a memory cell array, and a sense amplifier provided between one end of the memory cell array and the capacitor region.

7. The semiconductor device according to claim 6, wherein the bonding pad is a pad for which a pin capacitance is not prescribed.

8. The semiconductor device according to claim 6, wherein the bonding pad is a power supply pad.

9. A semiconductor device comprising:
a semiconductor chip which includes a semiconductor integrated circuit;
a bonding pad having an upper surface of which is exposed via an opening; and
capacitors provided in a capacitor region of the semiconductor chip under the bonding pad,
contacts respectively connected to two electrodes of the capacitors are provided at positions that do not vertically overlap the opening,
a dimension of each capacitor in a first direction is greater than a dimension of the opening,
a dimension of each capacitor in a second direction that intersects with the first direction is smaller than the dimension of the opening, and
the capacitors are disposed along the second direction in the capacitor region.

10. A semiconductor device comprising:
a semiconductor chip which includes a memory region where memory cells provided in an insulator are arranged, each of the memory cells including a charge storage layer, a control gate electrode, and an intergate insulating film between the charge storage layer and the control gate electrode;
a first pad having an upper surface of which is exposed via an opening formed in the insulator; and
capacitors provided in a capacitor region of the semiconductor chip under the pad, and
contacts respectively connected to two electrodes of the capacitors are provided at positions that do not vertically overlap the opening.

11. The semiconductor device according to claim 10, wherein
each of the capacitors includes
a semiconductor region in the capacitor region,
a first insulating film on the semiconductor region,
a first electrode on the first insulating film,
first and second contacts on one end of the semiconductor region and the other, and
third and fourth contacts on one end of the first electrode and the other.

12. The semiconductor device according to claim 11, wherein
the first and second contacts are provided on the semiconductor region to face each other in a first direction, and
the third and fourth contacts are provided on the first electrode to face each other in a second direction that intersects with the first direction.

13. The semiconductor device according to claim 11, wherein
each capacitor includes
a second insulating film on the first electrode,
a second electrode on the second insulating film, and
fifth and sixth contacts on one end of the second electrode and the other.

14. The semiconductor device according to claim 13, wherein
a first capacitance is formed between the semiconductor region and the first electrode, and a second capacitance is formed between the first electrode and the second electrode.

15. The semiconductor device according to claim 10, wherein
the semiconductor chip includes a protection element region adjacent to the capacitor region, and
the capacitor region and the protection element region include p-type well regions.

16. The semiconductor device according to claim 10, wherein
the semiconductor integrated circuit includes a sense amplifier provided between one end of the memory region and the capacitor region.

17. The semiconductor device according to claim 10, wherein
the first pad is a pad for which a pin capacitance is not prescribed.

18. The semiconductor device according to claim 10, wherein
the first pad is a power supply pad.

19. The semiconductor device according to claim 10, wherein
a dimension of each capacitor in a first direction is greater than a dimension of the opening,
a dimension of each capacitor in a second direction that intersects with the first direction is smaller than the dimension of the opening, and
the capacitors are disposed along the second direction in the capacitor region at regular intervals.

* * * * *